(12) United States Patent  
Shimoma

(10) Patent No.: US 12,372,860 B2
(45) Date of Patent: Jul. 29, 2025

(54) PROJECTOR AND COOLING DEVICE

(71) Applicant: SEIKO EPSON CORPORATION, Tokyo (JP)

(72) Inventor: Shohei Shimoma, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 438 days.

(21) Appl. No.: 17/896,302

(22) Filed: Aug. 26, 2022

(65) Prior Publication Data

US 2023/0063232 A1 Mar. 2, 2023

(30) Foreign Application Priority Data

Aug. 27, 2021 (JP) ................. 2021-139071

(51) Int. Cl.
*G03B 21/16* (2006.01)
*H05K 7/20* (2006.01)

(52) U.S. Cl.
CPC ......... *G03B 21/16* (2013.01); *H05K 7/20145* (2013.01); *H05K 7/20163* (2013.01)

(58) Field of Classification Search
CPC . G03B 21/16; H05K 7/20145; H05K 7/20163
USPC .......................................................... 353/52
See application file for complete search history.

(56) References Cited

U.S. PATENT DOCUMENTS

| | | | | |
|---|---|---|---|---|
| 2008/0055563 | A1* | 3/2008 | Momose | G03B 21/16 353/61 |
| 2009/0141249 | A1* | 6/2009 | Yanagisawa | G03B 21/16 353/61 |
| 2016/0301901 | A1* | 10/2016 | Ishii | H04N 9/3144 |
| 2016/0338226 | A1* | 11/2016 | Sakamoto | H05K 7/20136 |
| 2020/0272037 | A1 | 8/2020 | Yen et al. | |
| 2021/0203891 | A1 | 7/2021 | Kawase | |

FOREIGN PATENT DOCUMENTS

| | | | |
|---|---|---|---|
| CN | 103838067 A | 6/2014 | |
| CN | 111610685 A | 9/2020 | |
| JP | 2006343498 | 12/2006 | |
| JP | 2007280745 | 10/2007 | |
| JP | 2009229955 A | * 10/2009 | ............. G03B 21/16 |
| JP | 2009251370 A | * 10/2009 | ............. G03B 21/16 |
| JP | WO2019225013 | 6/2021 | |
| WO | WO2015107899 A | 7/2015 | |

* cited by examiner

*Primary Examiner* — Magda Cruz
(74) *Attorney, Agent, or Firm* — Dority & Manning, P.A.

(57) ABSTRACT

A projector according to the present disclosure includes: an exterior housing; a light source unit configured to emit illumination light; an image forming unit configured to generate image light; a projection optical unit configured to project the image light generated by the image forming unit; a first heat exchanger for heat absorption configured to absorb heat generated by the light source unit; a second heat exchanger for heat absorption configured to absorb heat generated by the image forming unit; a first heat exchanger for heat dissipation configured to dissipate heat transferred from the first heat exchanger for heat absorption; a second heat exchanger for heat dissipation configured to dissipate heat transferred from the second heat exchanger for heat absorption; and a heat exchanger fan configured to supply an air flow to the first heat exchanger for heat dissipation and the second heat exchanger for heat dissipation.

12 Claims, 15 Drawing Sheets

PROJECTOR AND COOLING DEVICE

The present application is based on, and claims priority from JP Application Serial Number 2021-139071, filed Aug. 27, 2021, the disclosure of which is hereby incorporated by reference herein in its entirety.

BACKGROUND

1. Technical Field

The present disclosure relates to a projector and a cooling device.

2. Related Art

JP-A-2006-343498 discloses a technique of receiving heat generated in a liquid crystal panel constituting an image forming unit of a projector and dissipating the heat using a radiator. JP-A-2007-280745 discloses a technique of receiving heat generated in a light source unit of a projector and dissipating the heat using a radiator.

It is also conceivable to combine the radiator that dissipates the heat from the liquid crystal panel and the radiator that dissipates the heat from the light source unit. On the other hand, in recent years, further miniaturization of a projector is desired from the viewpoint of improving usability of the projector and the like. Therefore, it is desired to provide a new technique capable of reducing a size of a device configuration even when two radiators are used.

SUMMARY

In order to solve the above problems, according to a first aspect of the present disclosure, a projector is provided. The projector includes: an exterior housing constituting an exterior; a light source unit configured to emit illumination light; an image forming unit configured to modulate the illumination light from the light source unit according to image information to generate image light; a projection optical unit configured to project the image light generated by the image forming unit; a first heat exchanger for heat absorption configured to absorb heat generated by the light source unit; a second heat exchanger for heat absorption configured to absorb heat generated by the image forming unit; a first heat exchanger for heat dissipation configured to dissipate heat transferred from the first heat exchanger for heat absorption; a second heat exchanger for heat dissipation configured to dissipate heat transferred from the second heat exchanger for heat absorption; and a heat exchanger fan configured to supply an air flow to the first heat exchanger for heat dissipation and the second heat exchanger for heat dissipation. The first heat exchanger for heat dissipation overlaps with the second heat exchanger for heat dissipation in a flow direction of the air flow, and the air flow flows from one of the first heat exchanger for heat dissipation and the second heat exchanger for heat dissipation toward the other one thereof.

Further, according to a second aspect of the present disclosure, a cooling device is provided. The cooling device includes: a first heat source and a second heat source disposed in an exterior housing constituting an exterior; a first heat exchanger for heat absorption configured to absorb heat generated by the first heat source; a second heat exchanger for heat absorption configured to absorb heat generated by the second heat source; a first heat exchanger for heat dissipation configured to dissipate heat transferred from the first heat exchanger for heat absorption; a second heat exchanger for heat dissipation configured to dissipate heat transferred from the second heat exchanger for heat absorption; and a heat exchanger fan configured to supply an air flow to the first heat exchanger for heat dissipation and the second heat exchanger for heat dissipation. The first heat exchanger for heat dissipation overlaps with the second heat exchanger for heat dissipation in a flow direction of the air flow, and the air flow flows from one of the first heat exchanger for heat dissipation and the second heat exchanger for heat dissipation toward the other one thereof.

DESCRIPTION OF EXEMPLARY EMBODIMENTS

Embodiments of the present disclosure will be described with reference to the drawings.

In the following drawings, a scale of size may be changed depending on components in order to make the components easy to see.

First Embodiment

Figure 1:
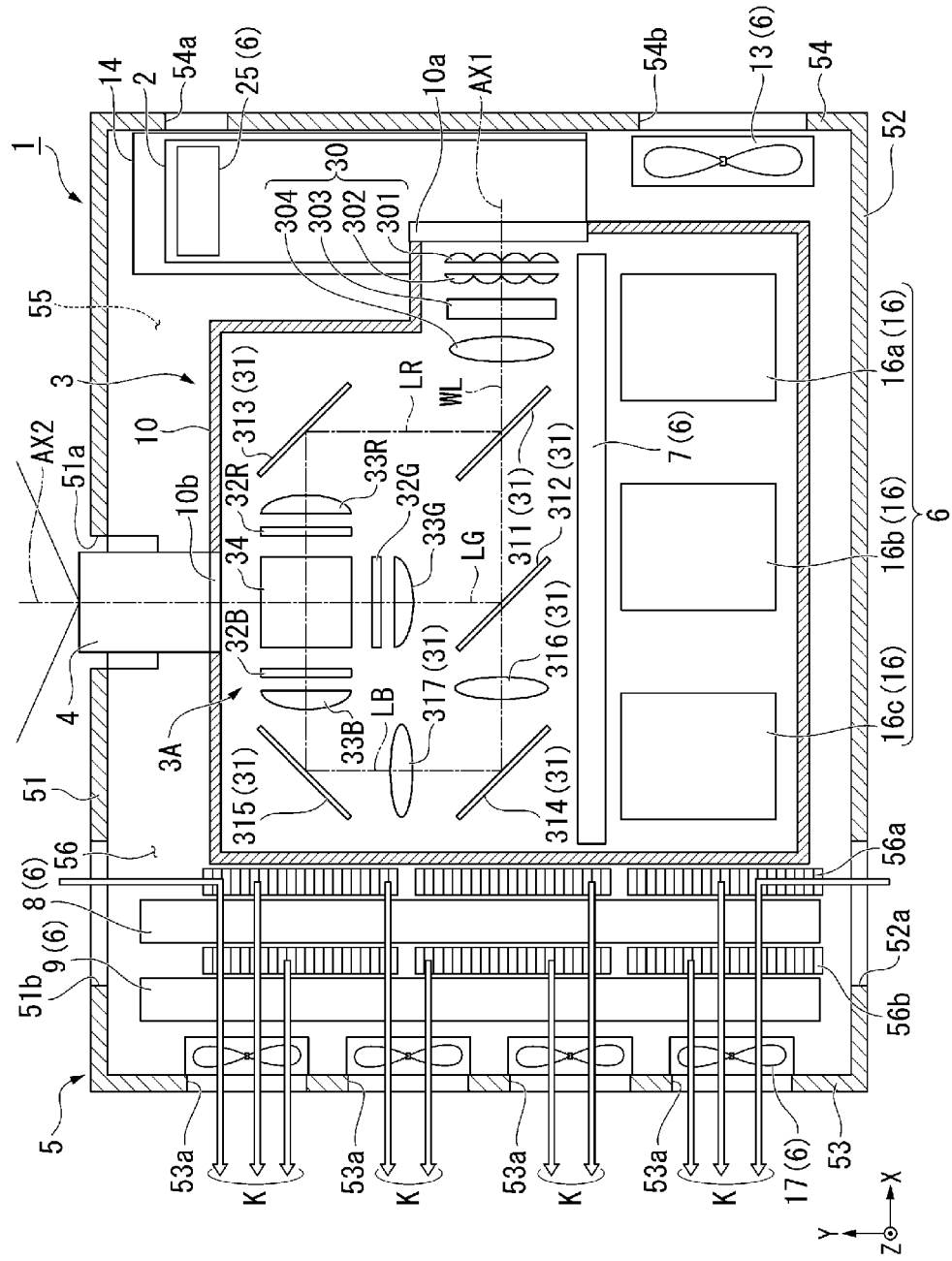
FIG. 1 is a diagram showing a configuration of a projector according to a first embodiment.

FIG. 1 is a diagram showing a configuration of a projector according to the present embodiment.

A projector 1 according to the present embodiment modulates illumination light emitted from a light source unit 2 to generate image light according to image information, and enlarges and projects the generated image light onto a projection surface such as a screen. As shown in FIG. 1, the projector 1 includes the light source unit 2, an image forming unit 3, a projection optical unit 4, an exterior housing 5, a cooling device 6 and a power supply unit 14.

In the following description, an XYZ orthogonal coordinate system is used as needed.

In the drawings, an X axis is an axis along an optical axis AX1 of illumination light WL emitted from the light source unit 2 toward the image forming unit 3. A Y axis is an axis orthogonal to the X axis and along a direction in which the projection optical unit 4 projects image light, that is, an axis along an optical axis AX2 of the projection optical unit 4. A Z axis is an axis orthogonal to the optical axis AX1 and the optical axis AX2.

In the present embodiment, a direction along the Z axis is referred to as an "up-down direction Z", +Z is referred to as an "upper side", and −Z is referred to as a "lower side". A direction along the X axis is referred to as a "left-right direction X", +X is referred to as a "right side", and −X is referred to as a "left side". A direction along the Y axis is referred to as a "front-rear direction Y", +Y is referred to as a "front side", and −Y is referred to as a "rear side".

The up-down direction Z, the left-right direction X and the front-rear direction Y are merely names for showing an arrangement relation of the components of the projector 1, and do not define actual installation postures and directions in the projector 1.

The light source unit 2 supplies the white illumination light WL to an image forming portion 3A of the image forming unit 3. The light source unit 2 is coupled to a light source unit coupling portion 10a provided in a case 10. A configuration of the light source unit 2 will be described in detail later.

The light source unit coupling portion 10a is implemented by, for example, a window portion having a light transmitting property. As long as the light source unit coupling portion 10a allows the inside of the case 10 to be sealed when the light source unit 2 is coupled, the light source unit coupling portion 10a may be an opening formed in the case 10.

Based on such a configuration, the image forming unit 3 according to the present embodiment can cause the illumination light WL from the light source unit 2 to be incident on light modulation panels 32R, 32G, and 32B via the light source unit coupling portion 10a of the case 10.

The image forming unit 3 houses at least the image forming portion 3A, a heat exchanger 7 for panel heat absorption that is a second heat exchanger for heat absorption, and panel fans 16 in a sealed state in the case 10 that has a sealed structure. The case 10 houses the image forming portion 3A, the heat exchanger 7 for panel heat absorption and the panel fans 16 in a state in which these components are held in predetermined positions. The image forming unit 3 houses the image forming portion 3A, the heat exchanger 7 for panel heat absorption and the panel fans 16 by arranging these components in order in the case 10 from the front side that is the +Y side to the rear side that is the −Y side.

In the case 10 of the image forming unit 3, the heat exchanger 7 for panel heat absorption partitions a housing portion for the image forming portion 3A and a housing portion for the panel fans 16 as housing spaces. In the present embodiment, the heat exchanger 7 for panel heat absorption is disposed along the left-right direction so as to divide a space inside the case 10 into two parts in the front-rear direction Y that is a second direction along the optical axis AX2.

In the case 10 of the image forming unit 3, the image forming portion 3A, the heat exchanger 7 for panel heat absorption and the panel fans 16 are arranged in the front-rear direction Y. A heat exchanger 8 for panel heat dissipation, which is a second heat exchanger for heat dissipation, is adjacent to the −X side of the case 10 and extends along the front-rear direction Y.

The image forming portion 3A includes the light modulation panels 32R, 32G and 32B, and a cross dichroic prism 34. Each of the light modulation panels 32R, 32G, and 32B modulates incident color light according to image information and forms image light. Each of the light modulation panels 32R, 32G, and 32B is implemented by a light transmissive liquid crystal panel. Detailed configurations of the light modulation panels 32R, 32G, and 32B will be described later.

The cross dichroic prism 34 synthesizes image light emitted from the light modulation panels 32R, 32G, and 32B. The cross dichroic prism 34 has a substantially square shape in a plan view in which four right-angle prisms are bonded together, and a dielectric multilayer film is provided on a substantially X-shaped interface where the right-angle prisms are bonded together.

Based on such a configuration, the image forming portion 3A of the present embodiment generates full-color image light by synthesizing the image light having plural colors.

In the present embodiment, field lenses 33R, 33G, and 33B are provided on light incident sides of the light modulation panels 32R, 32G, and 32B, respectively.

Although not shown, incident side polarizing plates are respectively disposed between the light modulation panels 32R, 32G, and 32B and the field lenses 33R, 33G, and 33B, and emission side polarizing plates are respectively disposed between the light modulation panels 32R, 32G, and 32B and the cross dichroic prism 34.

In the present embodiment, the image forming unit 3 further includes a uniform illumination optical system 30 and a color separation light guide optical system 31 housed in the case 10. The case 10 houses the uniform illumination optical system 30 and the color separation light guide optical system 31 in a state in which these components are held at predetermined positions.

The illumination light WL emitted from the light source unit 2 is incident on the uniform illumination optical system 30.

The uniform illumination optical system 30 includes a first lens array 301, a second lens array 302, a polarization conversion element 303, and a superimposing lens 304.

The first lens array 301 includes a plurality of first small lenses that divide the illumination light WL from the light source unit 2 into a plurality of partial light beams. The plurality of first small lenses are arranged in a matrix in a plane orthogonal to the optical axis AX1 of the illumination light WL.

The second lens array 302 includes a plurality of second small lenses corresponding to the plurality of first small lenses of the first lens array 301. The plurality of second small lenses are arranged in a matrix in a plane orthogonal to the optical axis AX1.

The second lens array 302, together with the superimposing lens 304, forms an image of each first small lens of the first lens array 301 in the vicinity of image formation regions of the light modulation panels 32R, 32G, and 32B.

The polarization conversion element 303 converts light emitted from the second lens array 302 into one linearly polarized light. The polarization conversion element 303 includes, for example, a polarization separation film and a retardation plate that are not shown.

The superimposing lens 304 focuses the partial light beams emitted from the polarization conversion element 303 and superimposes the partial light beams in the vicinity of the image formation regions of the light modulation panels 32R, 32G, and 32B.

The separation light guide optical system 31 separates the illumination light WL passing through the uniform illumination optical system 30 into red light LR, green light LG, and blue light LB, and guides the red light LR, the green light LG, and the blue light LB to the light modulation panels 32R, 32G, and 32B. The separation light guide optical system 31 includes a first dichroic mirror 311, a second dichroic mirror 312, a first reflection mirror 313, a second reflection mirror 314, a third reflection mirror 315, a first relay lens 316, and a second relay lens 317.

The first dichroic mirror 311 reflects the red light LR and transmits the green light LG and the blue light LB. The second dichroic mirror 312 reflects the green light LG and transmits the blue light LB of the green light LG and the blue light LB transmitted through the first dichroic mirror 311. The first reflection mirror 313 reflects the red light LR. The second reflection mirror 314 and the third reflection mirror 315 reflect the blue light LB. The first relay lens 316 is disposed between the second dichroic mirror 312 and the second reflection mirror 314, and the second relay lens 317 is disposed between the second reflection mirror 314 and the third reflection mirror 315.

The projection optical unit 4 is coupled to a projection optical unit coupling portion 10b provided in the case 10. The projection optical unit 4 includes a group of projection lenses, and receives light from the light modulation panels 32R, 32G and 32B of the image forming portion 3A via the projection optical unit coupling portion 10b of the case 10.

The projection optical unit coupling portion 10b is implemented by, for example, a window portion having a light transmitting property. As long as the projection optical unit coupling portion 10b allows the inside of the case 10 to be sealed when the projection optical unit 4 is coupled, the projection optical unit coupling portion 10b may be an opening formed in the case 10. The projection optical unit coupling portion 10b may include a lens shift mechanism that shifts the optical axis AX2 of the projection optical unit 4.

Based on such a configuration, the image forming unit 3 according to the present embodiment can enlarge and project image light generated by the image forming unit 3 toward a projection surface such as a screen via the projection optical unit coupling portion 10b of the case 10. Accordingly, an enlarged color image is displayed on the screen.

The exterior housing 5 houses the light source unit 2, the image forming unit 3, the cooling device 6 and the power supply unit 14 therein, and constitutes an exterior of the projector 1.

In the projector 1 according to the present embodiment, two heat sources are disposed in the exterior housing 5. Specifically, the first heat source corresponds to the light source unit 2, and the second heat source corresponds to the light modulation panels 32R, 32G, and 32B in the image forming unit 3.

The projector 1 according to the present embodiment includes the cooling device 6 that cools heat generated by the two heat sources.

The cooling device 6 includes a heat exchanger 25 for light source heat absorption, which is a first heat exchanger for heat absorption, that absorbs heat generated by the light source unit 2 that is the first heat source, the heat exchanger 7 for panel heat absorption that absorbs heat generated by the light modulation panels 32R, 32G and 32B that are the second heat source, a heat exchanger 9 for light source heat dissipation that is a first heat exchanger for heat dissipation and dissipates heat transferred from the heat exchanger 25 for light source heat absorption, the heat exchanger 8 for panel heat dissipation that dissipates heat transferred from the heat exchanger 7 for panel heat absorption, heat exchanger fans 17 that supply an air flow to the heat exchanger 8 for panel heat dissipation and the heat exchanger 9 for light source heat dissipation, and a heat exhaust fan 13.

In the cooling device 6, the heat exchanger 8 for panel heat dissipation and the heat exchanger 9 for light source heat dissipation overlap with each other in a flow direction of an air flow K, and the air flow K flows from the heat exchanger 8 for panel heat dissipation toward the heat exchanger 9 for light source heat dissipation.

The exterior housing 5 includes a front surface portion 51, a rear surface portion 52, a left side surface portion 53, a right side surface portion 54, a top surface portion 55 and a bottom surface portion 56. The exterior housing 5 is formed in, for example, a substantially rectangular parallelepiped shape. In FIG. 1, in order to show an internal structure of the exterior housing 5, the top surface portion 55 is shown as a transparent member.

The front surface portion 51 is a plate-shaped portion that is located on the front side that is the +Y side in the front-rear direction Y and is along an XZ plane.

The rear surface portion 52 is a plate-shaped portion that is located on the rear side that is the −Y side in the front-rear direction Y and is along the XZ plane.

The left side surface portion 53 is a plate-shaped portion that is located on the left side that is the −X side in the left-right direction X and is along a YZ plane.

The right side surface portion 54 is a plate-shaped portion that is located on the right side that is the +X side in the left-right direction X and is along the YZ plane.

The top surface portion 55 is a plate-shaped portion that couples end portions of the front surface portion 51, the rear surface portion 52, the left side surface portion 53 and the right side surface portion 54 on the upper side that is the +Z side, and is along an XY plane.

The bottom surface portion 56 is a plate-shaped portion that couples end portions of the front surface portion 51, the rear surface portion 52, the left side surface portion 53 and the right side surface portion 54 on the lower side that is the −Z side, and is along the XY plane.

The front surface portion 51 has an opening 51a provided substantially in a center thereof. The projection optical unit 4 is inserted into the exterior housing 5 via the opening 51a and is coupled to the image forming unit 3. In the present embodiment, a front end portion of the projection optical unit 4 is in a state of protruding to the outside of the exterior housing 5 through the opening 51a, and the front end portion of the projection optical unit 4 may be located inside the exterior housing 5 with respect to the opening 51a.

In the present embodiment, the image forming unit 3, the heat exchanger 8 for panel heat dissipation and the heat exchanger 9 for light source heat dissipation are arranged in a direction along the X axis in a manner of overlapping with each other.

The bottom surface portion 56 of the exterior housing 5 includes an air inlet 56a that is a first air inlet, and an air inlet (second air inlet) 56b that is a second air inlet.

In the bottom surface portion 56, the air inlet 56a is provided at a position facing a space between the heat exchanger 8 for panel heat dissipation located, on an image forming unit 3 side of the heat exchanger 8 for panel heat dissipation and the heat exchanger 9 for light source heat dissipation, and the image forming unit 3, and introduces outside air into the exterior housing 5.

In the bottom surface portion 56, the air inlet 56b is provided at a position facing a space between the heat exchanger 8 for panel heat dissipation and the heat exchanger 9 for light source heat dissipation, and introduces the outside air into the exterior housing 5.

The air inlet 56b may be integrally formed with the air inlet 56a. That is, a part of the air inlet 56a may extend to the position facing the space between the heat exchanger 8 for panel heat dissipation and the heat exchanger 9 for light source heat dissipation.

The rear surface portion 52 of the exterior housing 5 includes an air inlet 52a (first air inlet). Similar to the air inlet 56a, the air inlet 52a is provided at a position facing the space between the heat exchanger 8 for panel heat dissipation and the image forming unit 3, and introduces the outside air into the exterior housing 5 as the air flow K. In the present embodiment, the air inlet 52a extends to a position facing the space between the heat exchanger 8 for panel heat dissipation and the heat exchanger 9 for light source heat dissipation.

The front surface portion 51 of the exterior housing 5 further includes an air inlet 51b that is the first air inlet. Similar to the air inlets 56a and 52a, the air inlet 51b is provided at a position facing the space between the heat exchanger 8 for panel heat dissipation and the image forming unit 3, and introduces the outside air into the exterior housing 5 as the air flow K. In the present embodiment, the air inlet 51b extends to a position facing the space between the heat exchanger 8 for panel heat dissipation and the heat exchanger 9 for light source heat dissipation.

Based on such a configuration, the heat exchanger fans 17 can efficiently introduce the air flow K into the exterior housing 5 via the air inlet 51b, the air inlet 52a, the air inlet 56a, and the air inlet 56b. A filter for collecting dust contained in the air flow K may be provided for each of the air inlets 51b, 52a, 56a, and 56b.

The heat exchanger fans 17 are disposed between the heat exchanger 8 for panel heat dissipation and the left side surface portion 53 that is an air discharge wall portion of the exterior housing 5. The left side surface portion 53 includes air outlets 53a provided at positions facing the heat exchanger 8 for panel heat dissipation. The air outlets 53a discharge an exhaust air in the exterior housing 5 by the heat exchanger fans 17 to the outside.

In the present embodiment, since the heat exchanger 9 for light source heat dissipation is disposed between the left side surface portion 53 and the heat exchanger 8 for panel heat dissipation, the air flows K introduced from the air inlet 52a and the air inlet 56a flow to the air outlets 53a by the heat exchanger fans 17 through the heat exchanger 8 for panel heat dissipation and the heat exchanger 9 for light source heat dissipation.

The right side surface portion 54 includes an air inlet 54a and an air outlet 54b. The air inlet 54a is provided at a position facing the light source unit 2, and introduces the outside air to a predetermined position of the light source unit 2. A filter for collecting dust contained in air passing through the air inlet 54a may be provided.

The air outlet 54b is provided at a position facing the heat exhaust fan 13. The heat exhaust fan 13 dissipates heat from the inside of the exterior housing 5 to the outside by discharging the heat from the inside of the exterior housing 5 to the outside thereof via the air outlet 54b.

Here, a layout of members housed in the exterior housing 5 of the projector 1 according to the present embodiment will be described.

In the exterior housing 5, the light source unit 2 is disposed on the right side, which is the +X side of the left-right direction X that is a first direction intersecting the optical axis AX2 of the projection optical unit 4, with respect to the image forming unit 3. In the exterior housing 5, the heat exchanger 8 for panel heat dissipation is disposed on the left side, which is the −X side of the left-right direction X, with respect to the image forming unit 3. The heat exchanger 8 for panel heat dissipation extends along the front-rear direction Y.

In the exterior housing 5, the heat exchanger 9 for light source heat dissipation is disposed on the left side that is the −X side of the left-right direction X with respect to the image forming unit 3. The heat exchanger 9 for light source heat dissipation extends along the front-rear direction Y. That is, according to the present embodiment, in the exterior housing 5, the heat exchanger 8 for panel heat dissipation and the heat exchanger 9 for light source heat dissipation are disposed on the left side that is the −X side of the image forming unit 3.

In the exterior housing 5, the power supply unit 14 is disposed on the right side that is the +X side with respect to the case 10 of the image forming unit 3. The power supply unit 14 supplies power to the light source unit 2 and the image forming portion 3A. The power supply unit 14 is disposed in the exterior housing 5 in a manner of overlapping with at least a part of the light source unit 2 in the up-down direction Z that is a third direction intersecting the front-rear direction Y along the optical axis AX2 and the left-right direction X. In the present embodiment, the power supply unit 14 is disposed on the lower side of the light source unit 2 that is the −Z side.

According to the projector 1 of the present embodiment, since the power supply unit 14 and the light source unit 2 overlap with each other in the up-down direction Z in the exterior housing 5, the size of the exterior housing 5 when viewed in a plan view from the up-down direction Z can be reduced as compared to a layout in which the power supply unit 14 and the light source unit 2 are disposed side by side in the left-right direction X or the front-rear direction Y. That is, according to the layout of the present embodiment, a foot space of the projector 1 can be reduced.

Figure 2:
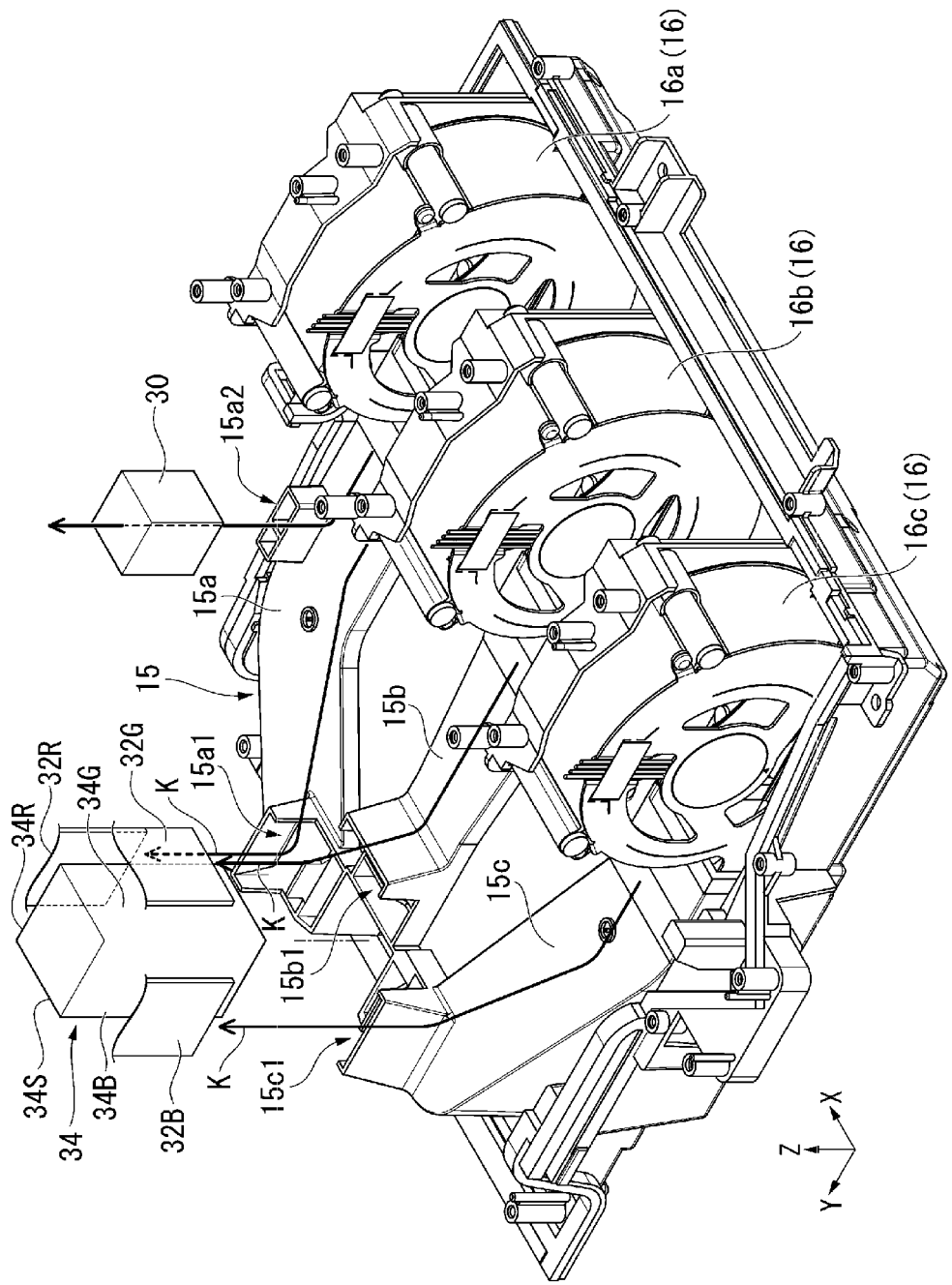
FIG. 2 is a view showing a configuration of panel fans and ducts.

FIG. 2 is a perspective view showing a configuration of main parts of the image forming portion 3A.

The image forming portion 3A includes the light modulation panels 32R, 32G and 32B, and the cross dichroic prism 34. The light modulation panel 32R is a red liquid crystal panel corresponding to the red light LR. The light modulation panel 32G is a green liquid crystal panel corresponding to the green light LG. The light modulation panel 32B is a blue liquid crystal panel corresponding to the blue light LB.

As shown in FIG. 2, the cross dichroic prism 34 includes three incident surfaces 34R, 34G, and 34B that face the light modulation panels 32R, 32G and 32B and on which the color light passed through the light modulation panels 32R, 32G and 32B are respectively incident, and an emission surface 34S.

In the projector 1 according to the present embodiment, the light modulation panels 32R, 32G and 32B that generate heat are cooled by supplying the air flow K with the panel fans 16. The panel fans 16 supply the air flow K to the light modulation panels 32R, 32G and 32B via respective ducts 15.

Examples of the panel fans 16 include a centrifugal fan and a sirocco fan, and the type of the fans is not limited thereto. In the present embodiment, a plurality of the panel fans 16 are provided in the case 10. The panel fans 16 include a first fan 16a, a second fan 16b, and a third fan 16c.

The first fan 16a supplies an air flow to the light modulation panel 32R, the second fan 16b supplies an air flow to the light modulation panel 32G, and the third fan 16c supplies an air flow to the light modulation panel 32B. Hereinafter, when the first fan 16a, the second fan 16b, and the third fan 16c are generally referred to without particular distinction, the first fan 16a, the second fan 16b, and the third fan 16c may be simply referred to as the fans 16a, 16b, and 16c.

The fans 16a, 16b, and 16c constituting the panel fans 16 are arranged in the left-right direction X along the heat exchanger 7 for panel heat absorption. The air flow K of the fans 16a, 16b, and 16c flows to the light modulation panels 32R, 32G and 32B of the image forming portion 3A via the ducts 15 provided among the heat exchanger 7 for panel heat absorption, the image forming portion 3A and the exterior housing 5.

The ducts 15 include a first duct portion 15a, a second duct portion 15b and a third duct portion 15c.

The first duct portion 15a includes a supply port 15a1 that supplies the air flow K to the light modulation panel 32R, the second duct portion 15b includes a supply port 15b1 that supplies the air flow K to the light modulation panel 32G, and the third duct portion 15c includes a supply port 15c1 that supplies the air flow K to the light modulation panel 32B.

By supplying the air flows K from the individual fans to the light modulation panels 32R, 32G, and 32B in this way, the cooling performances of the light modulation panels 32R, 32G, and 32B are enhanced.

Here, the degree of heat generation in the light modulation panels 32R, 32G, and 32B may be different for each panel. For example, a heat generation amount of the light modulation panel 32G is larger than those of the light modulation panels 32R and 32B. This is because the light modulation panel 32G receives more light than the light modulation panels 32R and 32B when a color balance of the illumination light WL is taken into consideration.

The light modulation panel 32B receives high-energy light of a short-wavelength band from the light source unit 2, and thus it is necessary to improve light resistance as compared with the light modulation panels 32R and 32G.

The cooling performance of the image forming unit 3 according to the present embodiment is further improved by not only supplying the air flows from the fans to the highly exothermic light modulation panel 32G for green and the light modulation panel 32B for blue that is necessary to be improved in the light resistance but also cooling the light modulation panel 32G and the light modulation panel 32B with a liquid cooling device that uses a heat exchange liquid.

On the other hand, the heat generation amount of the light modulation panel 32R is less than those of the light modulation panels 32B and 32G. That is, the first fan 16a that supplies the air flow to the light modulation panel 32R is in a state of having surplus power with respect to the fans 16b and 16c. The first duct portion 15a according to the present embodiment is further provided with a supply port 15a2 for supplying a part of the air flow K toward the uniform illumination optical system 30. Therefore, by distributing a part of the air flow supplied from the first fan 16a to the uniform illumination optical system 30, both the light modulation panel 32R and the uniform illumination optical system 30 can be efficiently cooled by one fan. The light modulation panel 32R having a small heat generation amount is cooled by the air flow K supplied from the first duct portion 15a. A configuration for cooling the light modulation panels 32R, 32G, and 32B will be described later.

In the present embodiment, the fans 16a, 16b, and 16c are disposed on the rear side of the heat exchanger 7 for panel heat absorption that is the −Y side. Therefore, the air flow heated by cooling the light modulation panels 32R, 32G, and 32B passes through the heat exchanger 7 for panel heat absorption and is drawn into the fans 16a, 16b, and 16c again.

The heat exchanger 7 for panel heat absorption absorbs heat from the air flow K heated by the light modulation panels 32R, 32G, and 32B. In the present embodiment, the heat exchanger 7 for panel heat absorption faces the light modulation panel 32G.

The heat exchanger 7 for panel heat absorption is implemented by a radiator. The heat exchanger 7 for panel heat absorption is a heat exchanger that absorbs heat from the air flow K by exchanging heat between a heat exchange liquid flowing into the inside thereof and the air flow K. The heat exchange liquid, which is heated by absorbing heat from the air flow K and flows into the radiator heated, is supplied to the heat exchanger 8 for panel heat dissipation.

The heat exchanger 8 for panel heat dissipation dissipates heat from the heat exchange liquid supplied from the heat exchanger 7 for panel heat absorption. In the present embodiment, the heat exchanger 8 for panel heat dissipation is implemented by a radiator.

The heat exchanger 8 for panel heat dissipation is a heat exchanger that dissipates heat from the heat exchange liquid by exchanging heat with the air flow K via the heat exchange liquid flowing into the inside thereof. The heat exchange liquid cooled by the heat exchanger 8 for panel heat dissipation is supplied to the heat exchanger 7 for panel heat absorption again, and is used for the heat exchange with the air flow K heated by the light modulation panels 32R, 32G, and 32B. A circulation path of the heat exchange liquid between the heat exchanger 7 for panel heat absorption and the heat exchanger 8 for panel heat dissipation will be described later.

In the image forming unit 3 according to the present embodiment, the air flow K heated by the light modulation panels 32R, 32G, 32B is drawn into the fans 16a, 16b, and 16c at a decreased temperature by passing through the heat exchanger 7 for panel heat absorption. Therefore, the fans 16a, 16b, and 16c can supply the air flow K having a relatively low temperature with respect to the light modulation panels 32R, 32G, and 32B.

Therefore, according to the image forming unit 3 of the present embodiment, when the air flow K is circularly supplied to the light modulation panels 32R, 32G and 32B housed in the sealed space, the light modulation panels 32R, 32G and 32B can be efficiently cooled by lowering the temperature of the air flow K with the heat exchanger 7 for panel heat absorption. Further, by housing the light modulation panels 32R, 32G and 32B in the sealed space, the image forming unit 3 according to the present embodiment can prevent occurrence of problems such as deterioration of display quality due to adhesion of dust, foreign matters, and the like.

Next, a configuration of the light source unit 2 will be described.

Figure 3:
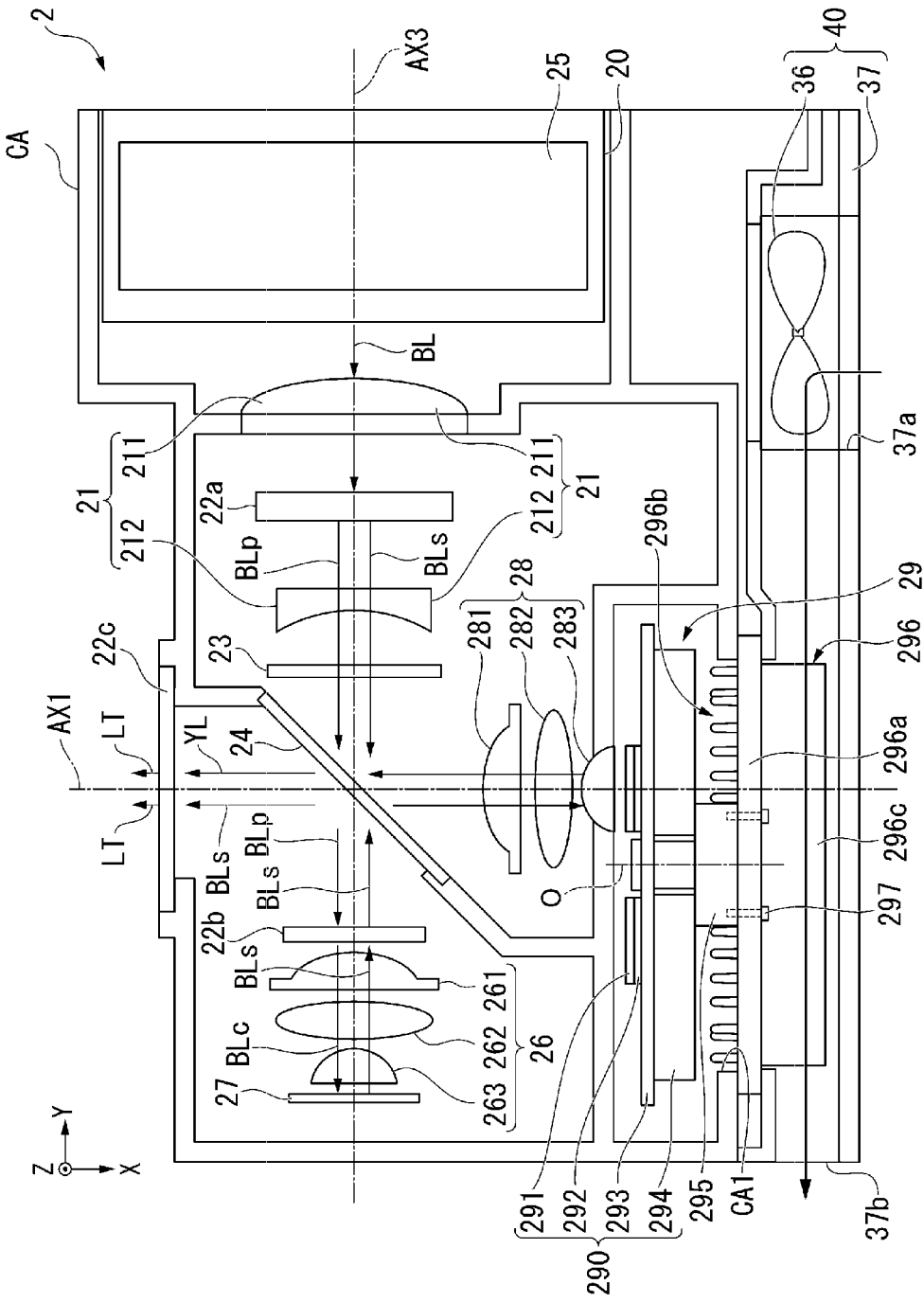
FIG. 3 is a schematic diagram showing a light source unit.

FIG. 3 is a schematic diagram showing the light source unit 2.

As shown in FIG. 3, the light source unit 2 includes a light source housing CA, a light source portion 20, an afocal optical element 21, a first retardation element 22a, a second retardation element 22b, a third retardation element 22c, a diffusion transmission element 23, a polarization separating and synthesizing element 24, a first light focusing element 26, a diffusion optical element 27, a second light focusing element 28, a wavelength conversion element 29 and a wheel cooling device 40.

The light source unit 2 has the optical axis AX1 extending along the X axis and an optical axis AX3 orthogonal to the optical axis AX1 and extending along the Y axis.

The light source portion 20, the afocal optical element 21, the first retardation element 22a, the diffusion transmission element 23, the polarization separating and synthesizing element 24, the second retardation element 22b, the first light focusing element 26 and the diffusion optical element 27 are disposed on the optical axis AX3.

The wavelength conversion element 29, the second light focusing element 28, the polarization separating and synthesizing element 24 and the third retardation element 22c are disposed on the optical axis AX1.

The light source housing CA is a sealed housing that houses the afocal optical element 21, the first retardation element 22a, the diffusion transmission element 23, the polarization separating and synthesizing element 24, the second retardation element 22b, the first light focusing element 26, the diffusion optical element 27, the second light focusing element 28, the wavelength conversion element 29, the third retardation element 22c and the light source portion 20, and dust and the like are not likely to intrude therein.

Figure 4:
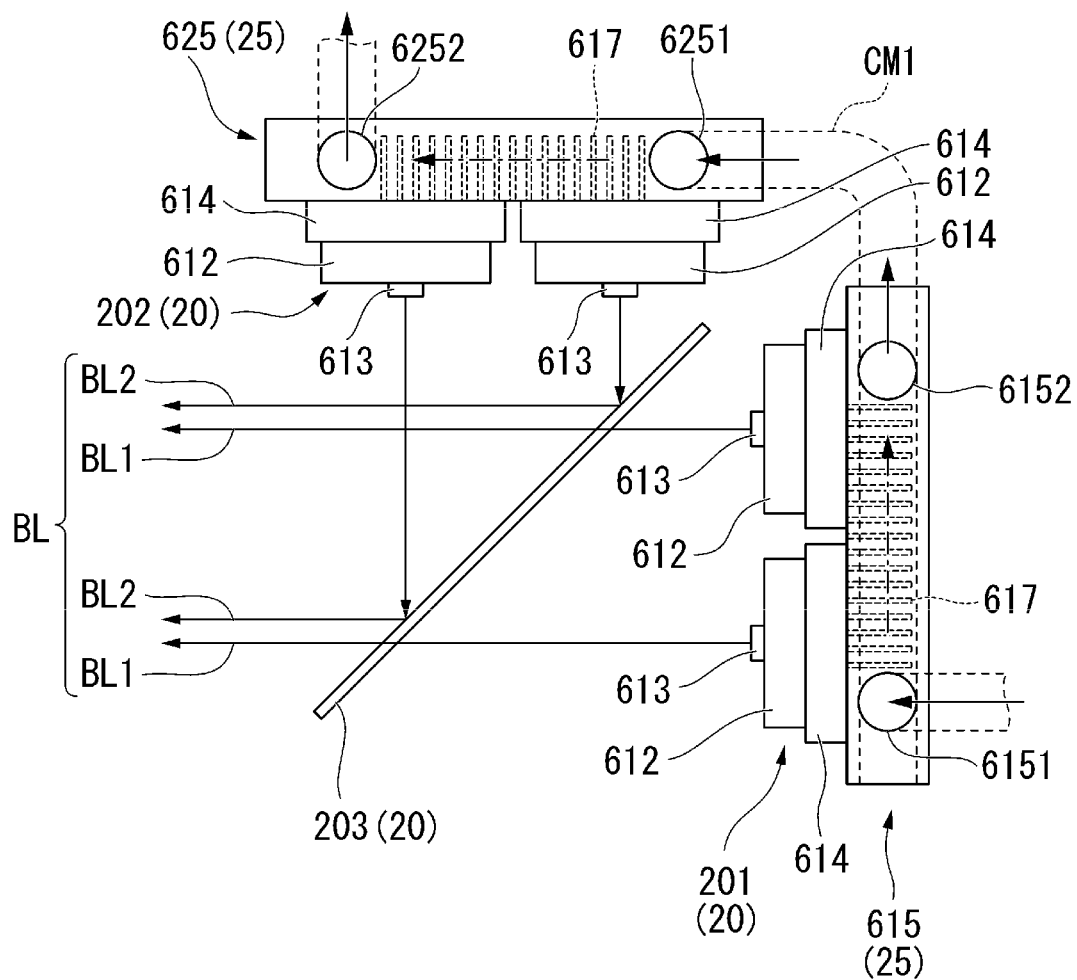
FIG. 4 is a schematic diagram showing a configuration of a light source portion.

FIG. 4 is a schematic diagram showing the configuration of the light source portion 20. Specifically, FIG. 4 is a diagram schematically showing a cross section of the light source portion 20 when viewed from the +X side.

The light source portion 20 emits light incident on the diffusion optical element 27 and the wavelength conversion element 29, which will be described later, in the −Y side. As shown in FIG. 4, the light source portion 20 includes a first light source module 201, a second light source module 202 and a light synthesizing member 203.

The first light source module 201 is disposed on the +Y side in the light source portion 20. The first light source module 201 includes a plurality of bases 612 arranged in a plane orthogonal to an optical axis of emitted blue light, and at least one light emitting element 613 is installed on each of the bases 612. The base 612 is made of a metal having a high heat transfer property, and transfers heat generated by the light emitting element 613 to a heat receiving plate 614. The number of light emitting elements 613 installed on the base 612 can be changed appropriately.

The light emitting element 613 is implemented by a semiconductor laser. Light emitted by the light emitting element 613 is, for example, a blue laser beam having a peak wavelength of 440 nm. Light emitted by the light emitting elements 613 is parallelized and emitted by a collimator lens (not shown). Based on such a configuration, the first light source module 201 emits blue light BL1 including a plurality of blue laser beams toward the light synthesizing member 203 as excitation light. Further, the first light source module 201 sets the orientation of the light emitting elements 613 so as to emit the blue light BL1 corresponding to P polarized light to the light synthesizing member 203.

On the other hand, the second light source module 202 is disposed on the +Z side in the light source portion 20. The second light source module 202 has the same configuration as the first light source module 201. The second light source module 202 emits blue light BL2 including a plurality of blue laser beams toward the light synthesizing member 203 as excitation light. Further, the second light source module 202 sets the orientation of the light emitting elements 613 so as to emit the blue light BL2 corresponding to S polarized light to the light synthesizing member 203.

In the light source portion 20, the first light source module 201 and the second light source module 202 have high temperature. Therefore, the light source portion 20 according to the present embodiment is provided with the heat exchanger 25 for light source heat absorption. The heat exchanger 25 for light source heat absorption absorbs heat generated by the light source unit 2 and cools the light source portion 20. A configuration of the heat exchanger 25 for light source heat absorption will be described in detail later.

The light synthesizing member 203 is provided at a position where an optical path of the blue light BL1 emitted from the first light source module 201 and an optical path of the blue light BL2 emitted from the second light source module 202 intersect each other. The light synthesizing member 203 according to the present embodiment is implemented by, for example, a polarization beam splitter. As described above, since the blue light BL1 emitted from the first light source module 201 is incident on the light synthesizing member 203 as the P polarized light, the blue light BL1 transmits the light synthesizing member 203 toward the −Y side. Further, since the blue light BL2 emitted from the second light source module 202 is incident on the light synthesizing member 203 as the S polarized light, the blue light BL2 is reflected toward the −Y side by the light synthesizing member 203, and thus the blue light BL1 and the blue light BL2 are synthesized and emitted toward the −Y side as blue light BL.

As shown in FIG. 3, the blue light BL emitted from the light source portion 20 is incident on the afocal optical element 21. The afocal optical element 21 adjusts a beam diameter of the blue light BL emitted from the light source portion 20. The afocal optical element 21 includes a lens 211 that focuses incident light and a lens 212 that parallelizes light focused by the lens 211. The afocal optical element 21 may be omitted.

The first retardation element 22a is provided between the lens 211 and the lens 212. The first retardation element 22a converts a part of the incident blue light BL, and emits light that includes blue light BLs having an S polarized light component with respect to the polarization separating and synthesizing element 24 to be described later and blue light BLp having a P polarized light component with respect to the polarization separating and synthesizing element 24 to be described later. The first retardation element 22a may be pivotable about a pivot shaft along the optical axis AX3 by a pivot device (not shown). In such a case, a ratio of the S polarized light component and the P polarized light component in the blue light emitted from the first retardation element 22a can be adjusted according to a pivot angle of the first retardation element 22a.

The diffusion transmission element 23 uniformizes an illumination distribution of the blue light BLp and the blue light BLs incident on the −Y side from the lens 212. The diffusion transmission element 23 may have a hologram or a plurality of small lenses arranged on a plane orthogonal to the optical axis, and a surface that light passes through may be a rough surface.

Instead of the diffusion transmission element 23, a homogenizer optical element having a pair of multi-lenses may be adopted.

The blue light BLs and the blue light BLp that passed through the diffusion transmission element 23 are incident on the polarization separating and synthesizing element 24.

The polarization separating and synthesizing element 24 has a function as a light separation element that separates incident light and a function as a light synthesis element that synthesizes incident light from two directions. In other words, the polarization separating and synthesizing element 24 functions as the light separation element as well as the light synthesis element.

The polarization separating and synthesizing element 24 is a polarization beam splitter, and separates the S polarized light component and the P polarized light component included in the incident light. Specifically, the polarization separating and synthesizing element 24 reflects the S polarized light component and transmits the P polarized light component. The polarization separating and synthesizing element 24 has a color separation characteristic of transmitting light having a predetermined wavelength or higher even for a polarized light component of the S polarized light component or the P polarized light component. Therefore, of the blue light BLp and the blue light BLs incident on the polarization separating and synthesizing element 24 from the diffusion transmission element 23, the blue light BLp of the P polarized light transmits the polarization separating and synthesizing element 24 toward the −Y side and is incident on the second retardation element 22*b*. Meanwhile, the blue light BLs of the S polarized light is reflected by the polarization separating and synthesizing element 24 toward the +X side and is incident on the second light focusing element 28.

In addition, the polarization separating and synthesizing element 24 may have a function of a half mirror that passes a part of light emitted from the light source portion 20 via the diffusion transmission element 23 and reflects the rest of the light, and a function of a dichroic mirror that reflects blue light emitted from the diffusion optical element 27, and transmits fluorescence that is emitted from the wavelength conversion element 29 and has a wavelength longer than the wavelength of the blue light. In this case, the first retardation element 22*a* may be omitted.

The second retardation element 22*b* is disposed on the −Y side with respect to the polarization separating and synthesizing element 24. That is, the second retardation element 22*b* is disposed between the polarization separating and synthesizing element 24 and the first light focusing element 26. The second retardation element 22*b* converts the blue light BLp that passed through the polarization separating and synthesizing element 24 into blue light BLc that is circularly polarized light. The blue light BLc passed through the second retardation element 22*b* toward the −Y side is incident on the first light focusing element 26.

The first light focusing element 26 focuses, on the diffusion optical element 27, the blue light BLc that is transmitted through the polarization separating and synthesizing element 24 toward the −Y side and is emitted from the second retardation element 22*b*. In addition, the first light focusing element 26 parallelizes light emitted from the diffusion optical element 27 toward the +Y side and emits the light to the second retardation element 22*b*. In the present embodiment, although the first light focusing element 26 includes three lenses 261, 262, and 263, and the number of lenses constituting the first light focusing element 26 is not limited.

The diffusion optical element 27 diffuses the incident blue light BLc at the same diffusion angle as fluorescence YL emitted from the wavelength conversion element 29. Specifically, the diffusion optical element 27 reflects and diffuses, toward the +Y side, the blue light BLc emitted from the first light focusing element 26 toward the −Y side. The diffusion optical element 27 is a reflective element that causes Lambert reflection of the incident blue light BLc. The diffusion optical element 27 may be rotated about a rotation shaft parallel to the optical axis AX3 by a rotation device.

The blue light BLc diffused by the diffusion optical element 27 passes through the first light focusing element 26 and is then incident on the second retardation element 22*b*. When the blue light Blc incident on the diffusion optical element 27 is reflected by the diffusion optical element 27, the blue light Blc is converted into a circularly polarized light having an opposite direction of rotation. Therefore, the blue light BLc incident on the second retardation element 22*b* via the first light focusing element 26 is converted into the blue light BLs of the S polarized light by the second retardation element 22*b*. Then, the blue light BLs is reflected by the polarization separating and synthesizing element 24 toward the −X side and is incident on the third retardation element 22*c*.

Meanwhile, the blue light BLs reflected by the polarization separating and synthesizing element 24 is incident on the second light focusing element 28. The second light focusing element 28 focuses the blue light BLs to the wavelength conversion element 29. Further, the second light focusing element 28 parallelizes the fluorescence YL emitted from the wavelength conversion element 29 toward the +X side, and emits the parallelized fluorescence YL to the polarization separating and synthesizing element 24. In the present embodiment, although the second light focusing element 28 includes three lenses 281, 282, and 283, and the number of lenses constituting the second light focusing element 28 is not limited.

The wavelength conversion element 29 converts a wavelength of the blue light BLs emitted from the second light focusing element 28.

That is, the wavelength conversion element 29 converts the blue light BLs emitted from the second light focusing element 28 into the fluorescence YL having a wavelength longer than the wavelength of the blue light BLs and emits the fluorescence YL. The wavelength conversion element 29 is a reflective wavelength conversion element that emits the fluorescence YL to an incident side of the blue light BLs.

The wavelength conversion element 29 includes a phosphor wheel 290, and a rotation device 295 that rotates the phosphor wheel 290 around a rotation shaft O. The wavelength conversion element 29 may be not rotated by the rotation device 295.

The phosphor wheel 290 includes a wavelength conversion layer 291, a reflective layer 292, a support substrate 293 and a wheel heat dissipating member 294. The wavelength conversion layer 291 includes a phosphor, and is provided in a ring shape about the rotation shaft of the phosphor wheel 290. The reflective layer 292 is provided on a side opposite to the incident side of the blue light BLs with respect to the wavelength conversion layer 291, and reflects light emitted from the wavelength conversion layer 291. The support substrate 293 supports the wavelength conversion layer 291 and the reflective layer 292. The wheel heat dissipating member 294 is formed on a surface of the support substrate 293 on the +X side. The wheel heat dissipating member 294 includes, for example, a plurality of heat dissipating fins.

In the present embodiment, the wavelength conversion element 29 is attached to the light source housing CA via a fixing member 296. The fixing member 296 is made of a metal member having excellent heat conductivity. The fixing member 296 is attached to the light source housing CA so as to close an opening CA1 provided in the light source housing CA. Accordingly, the wavelength conversion element 29 is disposed in a housing space for the wavelength conversion element 29 defined between the light source housing CA and the fixing member 296 in a state in which the phosphor wheel 290 faces the lens 283 of the second light focusing element 28.

An air flow is generated in the wheel heat dissipating member 294 as the phosphor wheel 290 rotates, so that the wavelength conversion element 29 according to the present embodiment dissipates heat from the phosphor wheel 290. In the present embodiment, since the housing space of the wavelength conversion element 29 is a sealed space, a temperature in the housing space is likely to increase. In view of this, in the present embodiment, the fixing member 296 is used as a cooling member of the phosphor wheel 290.

The fixing member 296 includes a base portion 296a, heat absorbing portions 296b, and a wheel heat dissipating portion 296c. The base portion 296a fixes the rotation device 295 of the wavelength conversion element 29 by screw members 297. The heat absorbing portions 296b include a plurality of protrusions provided on a surface of the base portion 296a on the −X side, which is a surface on a side facing the wavelength conversion element 29. The heat absorbing portion 296b absorbs heat from the housing space of the wavelength conversion element 29. The wheel heat dissipating portion 296c includes a plurality of heat dissipating fins provided on a surface of the base portion 296a on the +X side, which is a surface opposite to the wavelength conversion element 29. The heat dissipating fins constituting the wheel heat dissipating portion 296c are plate-shaped members along the XY plane, and are disposed at an interval along the up-down direction Z.

The wheel cooling device 40 includes a cooling fan 36 and a housing portion 37. The cooling fan 36 introduces outside air from an opening 37a of the housing portion 37. The opening 37a of the housing portion 37 is disposed at a position corresponding to the air inlet 54a formed in the right side surface portion 54 of the exterior housing 5. The housing portion 37 houses the cooling fan 36 and the wheel heat dissipating portion 296c of the fixing member 296 therein, and supplies the outside air introduced from the cooling fan 36 to the wheel heat dissipating portion 296c as an air flow. In the housing portion 37, the air flow heated by the wheel heat dissipating portion 296c is discharged from an outlet 37b provided in an end portion of the housing portion 37 on the −Y side.

In the wheel cooling device 40, an exhaust air from the outlet 37b of the housing portion 37 is discharged to the outside of the exterior housing 5 by the heat exhaust fan 13 shown in FIG. 1 via the air outlet 54b formed in the right side surface portion 54 of the exterior housing 5.

According to the light source unit 2 of the present embodiment, a temperature increase of the wavelength conversion element 29 is prevented by providing the wheel cooling device 40, and thus conversion efficiency of the fluorescence YL can be increased. Therefore, the bright fluorescence YL can be generated.

The fluorescence YL emitted from the wavelength conversion element 29 to the −X side is parallelized by the second light focusing element 28 and then is incident on the polarization separating and synthesizing element 24. As described above, the polarization separating and synthesizing element 24 has a property of transmitting the fluorescence YL, so that the fluorescence YL incident on the polarization separating and synthesizing element 24 along the −X side passes through the polarization separating and synthesizing element 24 and is incident on the third retardation element 22c. That is, the light incident on the third retardation element 22c from the polarization separating and synthesizing element 24 is white light in which the blue light BLs and the fluorescence YL are mixed.

The third retardation element 22c converts the white illumination light WL including the blue light BLs and the fluorescence YL emitted from the polarization separating and synthesizing element 24 into light in which the S polarized light and the P polarized light are mixed. In this way, the light source unit 2 emits the illumination light WL toward the color separation light guide optical system 31 disposed in the case 10 of the image forming unit 3.

Figure 5:
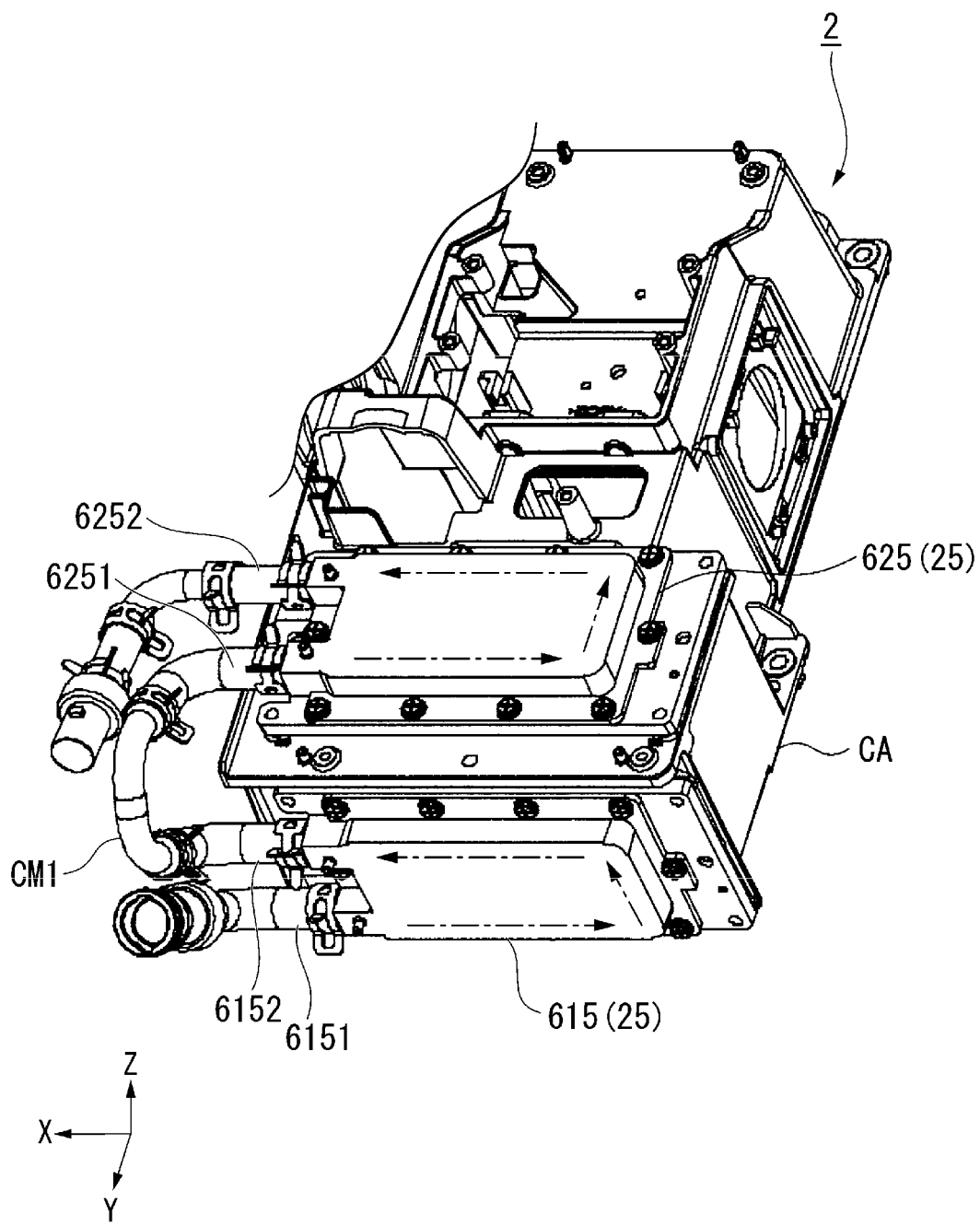
FIG. 5 is a perspective view showing the light source unit.

FIG. 5 is a perspective view showing the light source housing CA to which the first light source module 201, the second light source module 202 and the heat exchanger 25 for light source heat absorption are attached.

As shown in FIGS. 4 and 5, the heat exchanger 25 for light source heat absorption includes a first cooling plate 615 provided in the first light source module 201 and a second cooling plate 625 provided in the second light source module 202.

The first cooling plate 615 cools the first light source module 201 by transferring the heat transferred from the first light source module 201 via the heat receiving plate 614 to the heat exchange liquid flowing inside.

As shown in FIG. 4, the first cooling plate 615 is a heat exchanger that includes a cooling flow path, which is formed between a plurality of fins 617 provided inside and through which the heat exchange liquid is flowable, and transfers the heat transferred to the fins 617 to the heat exchange liquid.

The first cooling plate 615 includes an inflow portion 6151 into which the heat exchange liquid flows, and an outflow portion 6152 that flows the heat exchange liquid out. The inflow portion 6151 is provided on the −Z side of an end surface of the first cooling plate 615 on the +X side. The heat exchange liquid flows into the inflow portion 6151 from the outside. The inflow portion 6151 communicates with an internal space, and the heat exchange liquid flowed into the inflow portion 6151 flows into the cooling flow path provided inside. The outflow portion 6152 is provided on the +Z side of the end surface of the first cooling plate 615 on the +X side. The outflow portion 6152 communicates with the internal space, and flows the heat exchange liquid flowed through the cooling flow path to the outside.

The second cooling plate 625 cools the second light source module 202 by transferring the heat transferred from the second light source module 202 via the heat receiving plate 614 to the heat exchange liquid flowing inside.

The second cooling plate 625 has the same configuration as the first cooling plate 615, and is a heat exchanger that includes a cooling flow path, which is formed between the plurality of fins 617 provided inside and through which the heat exchange liquid is flowable, and transfers the heat transferred to the fins 617 to the heat exchange liquid.

The second cooling plate 625 includes an inflow portion 6251 into which the heat exchange liquid flows, and an outflow portion 6252 that flows the heat exchange liquid out.

The inflow portion 6251 is provided on the +Y side of an end surface of the second cooling plate 625 on the +X side. The heat exchange liquid flows into the inflow portion 6251 from the outside. The inflow portion 6251 communicates with an internal space, and the heat exchange liquid flowed into the inflow portion 6251 flows into the cooling flow path provided inside. The outflow portion 6252 is provided on the −Y side of the end surface of the second cooling plate 625 on the +X side. The outflow portion 6252 communicates with the internal space, and flows the heat exchange liquid flowed through the cooling flow path to the outside.

The outflow portion 6152 of the first cooling plate 615 is coupled to the inflow portion 6251 of the second cooling plate 625 via a pipe CM1. Therefore, the heat exchange liquid flowed out from the outflow portion 6152 of the first cooling plate 615 flows into the inflow portion 6251 of the second cooling plate 625. Further, as shown by arrows of a dashed line in FIG. 5, the heat exchange liquid flowed into the second cooling plate 625 flows through the second cooling plate 625 and is discharged from the outflow portion 6252 of the second cooling plate 625.

In this way, the heat exchanger 25 for light source heat absorption can absorb heat from the light source unit 2 using the first cooling plate 615 and the second cooling plate 625. The heat absorbed by the heat exchanger 25 for light source heat absorption is transferred to the heat exchanger 9 for light source heat dissipation.

Figure 6:
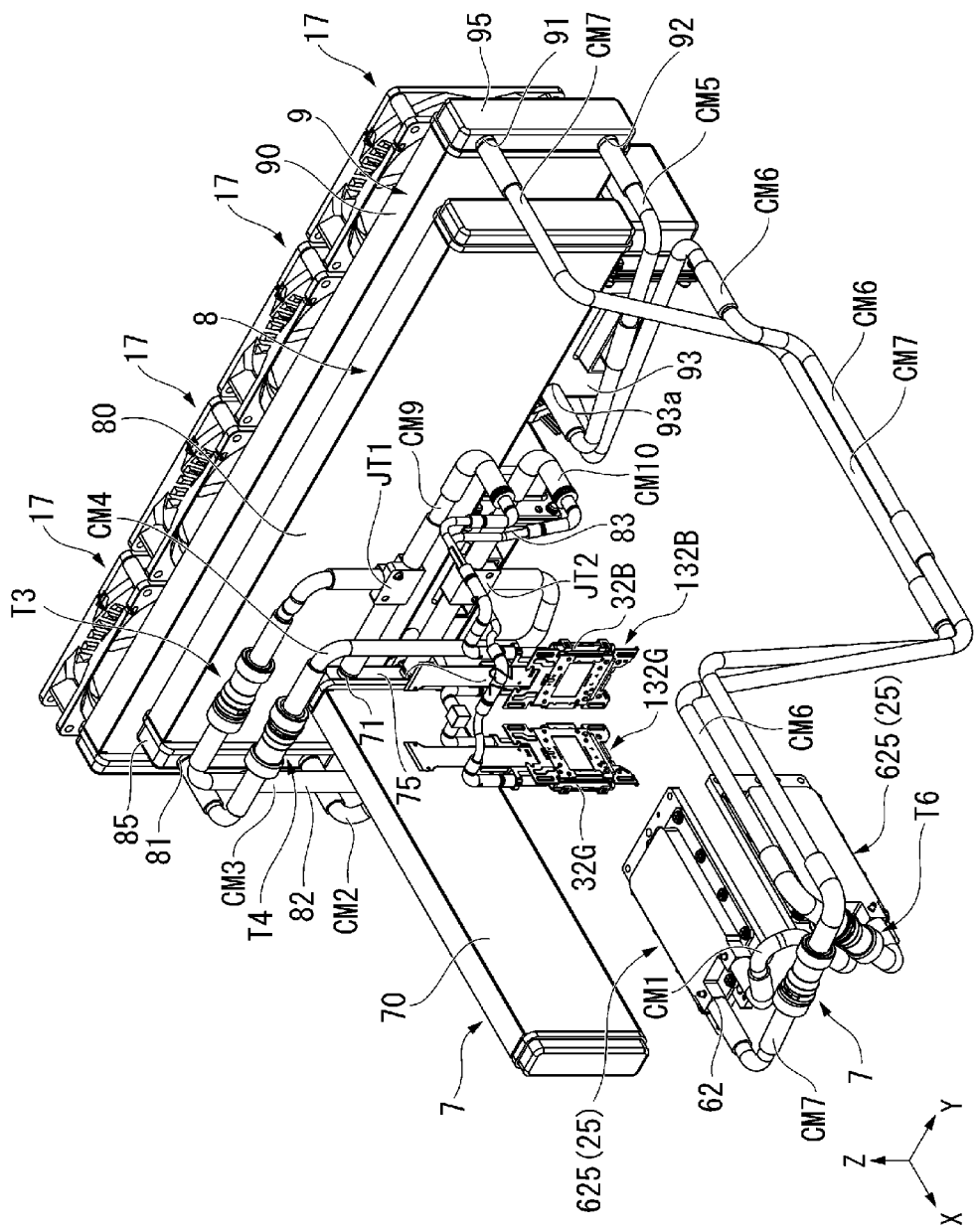
FIG. 6 is a perspective view showing a path of a heat exchange liquid that cools the light source unit.
Figure 7:
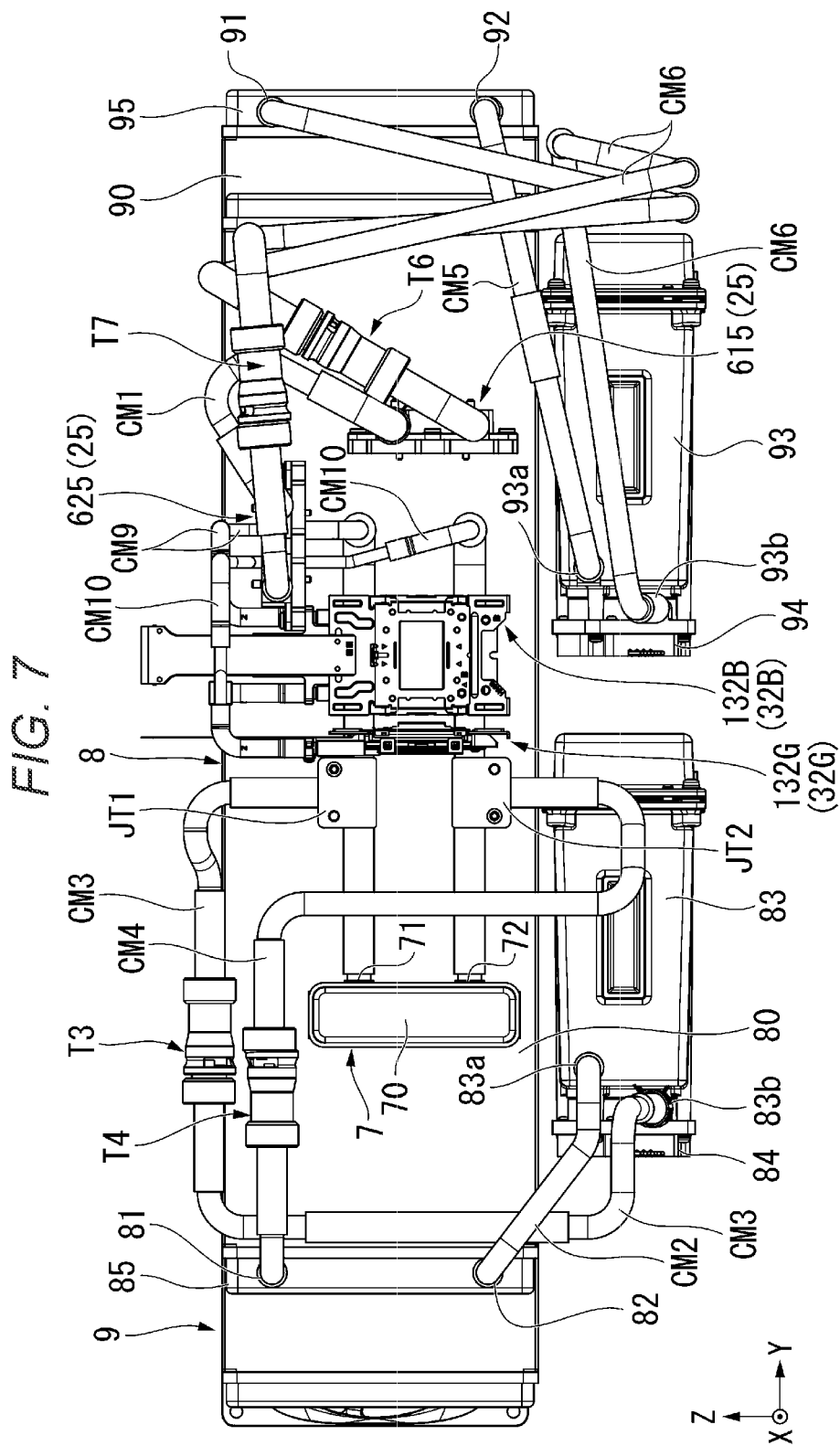
FIG. 7 is a plan view of FIG. 6 as seen from a +X side.

FIG. 6 is a perspective view showing a path of the heat exchange liquid between the heat exchanger 25 for light source heat absorption and the heat exchanger 9 for light source heat dissipation. FIG. 7 is a plan view of FIG. 6 as seen from the +X side. In FIGS. 6 and 7, a path of the heat exchange liquid between the heat exchanger 7 for panel heat absorption and the heat exchanger 8 for panel heat dissipation is also shown. Further, in FIG. 6, the heat exchanger fans 17 are also shown.

As shown in FIG. 6 or FIG. 7, the heat exchanger 7 for panel heat absorption is implemented by a radiator main body 70 that has a flat plate shape. A pipe coupling member 75 is attached to an end portion of the heat exchanger 7 for panel heat absorption on the −X side. The pipe coupling member 75 is disposed outside the case 10 that partitions the image forming unit 3.

The pipe coupling member 75 includes an inflow portion 71 that flows the heat exchange liquid into the radiator main body 70, and an outflow portion 72 that flows the heat exchange liquid out from the radiator main body 70. The inflow portion 71 is provided on an upper portion on the +Z side of an end surface of the pipe coupling member 75 on the +Y side. The heat exchange liquid flows into the inflow portion 71 from the heat exchanger 8 for panel heat dissipation. The inflow portion 71 communicates with the inside of the radiator main body 70, and the heat exchange liquid flowed into the inflow portion 71 flows into a flow path provided inside the radiator main body 70. The radiator main body 70 exchanges heat between an air flow passing from the +Y side to the −Y side and the heat exchange liquid flowing through the flow path so as to lower a temperature of the air flow.

The outflow portion 72 is provided on a lower portion on the −Z side of the end surface of the pipe coupling member 75 on the +Y side. The outflow portion 72 communicates with the inside of the radiator main body 70, and flows the heat exchange liquid that flows through the flow path and is heated by absorbing heat from an air flow in the image forming unit 3 to the outside.

The heat exchanger fans 17 are disposed on the −X side of the heat exchanger 8 for panel heat dissipation. As shown in FIG. 1, the heat exchanger fans 17 supply the air flow K to the heat exchanger 8 for panel heat dissipation. For example, axial flow fans can be used as the heat exchanger fans 17, and the type of fans is not limited thereto. In the present embodiment, the heat exchanger fans 17 are disposed along the Y axis in a manner of facing the heat exchanger 8 for panel heat dissipation. In the present embodiment, four heat exchanger fans 17 are provided, and the number of the heat exchanger fans 17 is not limited to four.

The heat exchanger 8 for panel heat dissipation includes a radiator main body 80 having a flat plate shape, a reservoir tank 83, and a pump 84. A pipe coupling member 85 is attached to an end portion of the radiator main body 80 on the −Y side.

The pipe coupling member 85 includes an inflow portion 81 that flows the heat exchange liquid into the radiator main body 80, and an outflow portion 82 that flows the heat exchange liquid out from the radiator main body 80. The inflow portion 81 is provided on an upper portion on the +Z side of an end surface of the pipe coupling member 85 on the +X side. The inflow portion 81 communicates with the inside of the radiator main body 80, and the heat exchange liquid flowed into the inflow portion 81 flows into a flow path provided inside the radiator main body 80. The radiator main body 80 exchanges heat between an air flow passing from the +X side to the −X side and the heat exchange liquid flowing through the flow path so as to lower a temperature of the heat exchange liquid. The outflow portion 82 is provided on a lower portion on the −Z side of the end surface of the pipe coupling member 85 on the +X side. The outflow portion 82 communicates with the inside of the radiator main body 80, and flows the heat exchange liquid whose temperature was lowered by flowing through the flow path to the outside.

In the heat exchanger 8 for panel heat dissipation, the outflow portion 82 of the pipe coupling member 85 is coupled to an inlet 83a of the reservoir tank 83 via a pipe CM2. A pipe CM3 is coupled to an outlet 83b of the reservoir tank 83. The pipe CM2 and the pipe CM3 are bent into a predetermined shape by combining a plurality of pipe members and a plurality of coupling members.

The pump 84 discharges the heat exchange liquid from the outlet 83b of the reservoir tank 83. The heat exchange liquid discharged from the outlet 83b of the reservoir tank 83 flows into the inflow portion 71 of the pipe coupling member 75 in the heat exchanger 7 for panel heat absorption via the pipe CM3.

In the heat exchanger 8 for panel heat dissipation, the inflow portion 81 of the pipe coupling member 85 is coupled to the outflow portion 72 of the pipe coupling member 75 in the heat exchanger 7 for panel heat absorption via a pipe CM4. The pipe CM4 is bent into a predetermined shape by combining a plurality of pipe members and a plurality of coupling members.

Based on such a configuration, the heat exchange liquid discharged from the heat exchanger 7 for panel heat absorption flows into the heat exchanger 8 for panel heat dissipation via the pipe CM4.

In the present embodiment, the pipe CM3 includes a coupling portion T3, and the pipe CM4 includes a coupling portion T4. The coupling portion T3 and the coupling portion T4 are provided in respective portions where the pipes CM3 and CM4 are close to each other. The pipe CM3 may be separated into two parts at the coupling portion T3, and the pipe CM4 may be separated into two parts at the coupling portion T4.

The image forming unit 3 according to the present embodiment is easily removable from the inside of the exterior housing 5 by separating the pipes CM3 and CM4 into the two parts at the coupling portions T3 and T4, respectively.

According to this configuration, when a failure occurs in the image forming unit 3, the image forming unit 3 can be easily repaired by removing and replacing the failed image forming unit 3 with a new unit, and thus the maintainability of the projector 1 can be improved.

As shown in FIG. 1, the heat exchanger fans 17 flow the air flow K flowing from the +X side to the −X side to the heat exchanger 8 for panel heat dissipation. At this time, since the heat exchange liquid flowing through the flow path in the radiator main body 80 and the air flow K passing through the radiator main body 80 exchange heat, the temperature of the heat exchange liquid flowing through the flow path in the radiator main body 80 can be lowered. Based on such a configuration, the heat exchanger 8 for panel heat dissipation can dissipate the heat transferred from the heat exchanger 7 for panel heat absorption. The heat exchange liquid cooled by the heat exchanger 8 for panel heat dissipation is supplied from the reservoir tank 83 to the heat exchanger 7 for panel heat absorption by the pump 84 as described above.

According to the projector 1 of the present embodiment, the cooling efficiency of the heat exchanger 7 for panel heat absorption can be improved by circulating the heat exchange liquid between the heat exchanger 7 for panel heat absorption and the heat exchanger 8 for panel heat dissipation. Therefore, the light modulation panels 32R, 32G, and 32B can be cooled stably and efficiently.

The image forming unit 3 according to the present embodiment includes a liquid cooling device 132G provided in the light modulation panel 32G, and a liquid cooling device 132B provided in the light modulation panel 32B. The liquid cooling device 132G is a device that uses a heat exchange liquid to cool heat generated by the light modulation panel 32G. The liquid cooling device 132B is a device that uses a heat exchange liquid to cool heat generated by the light modulation panel 32B.

Figure 8:
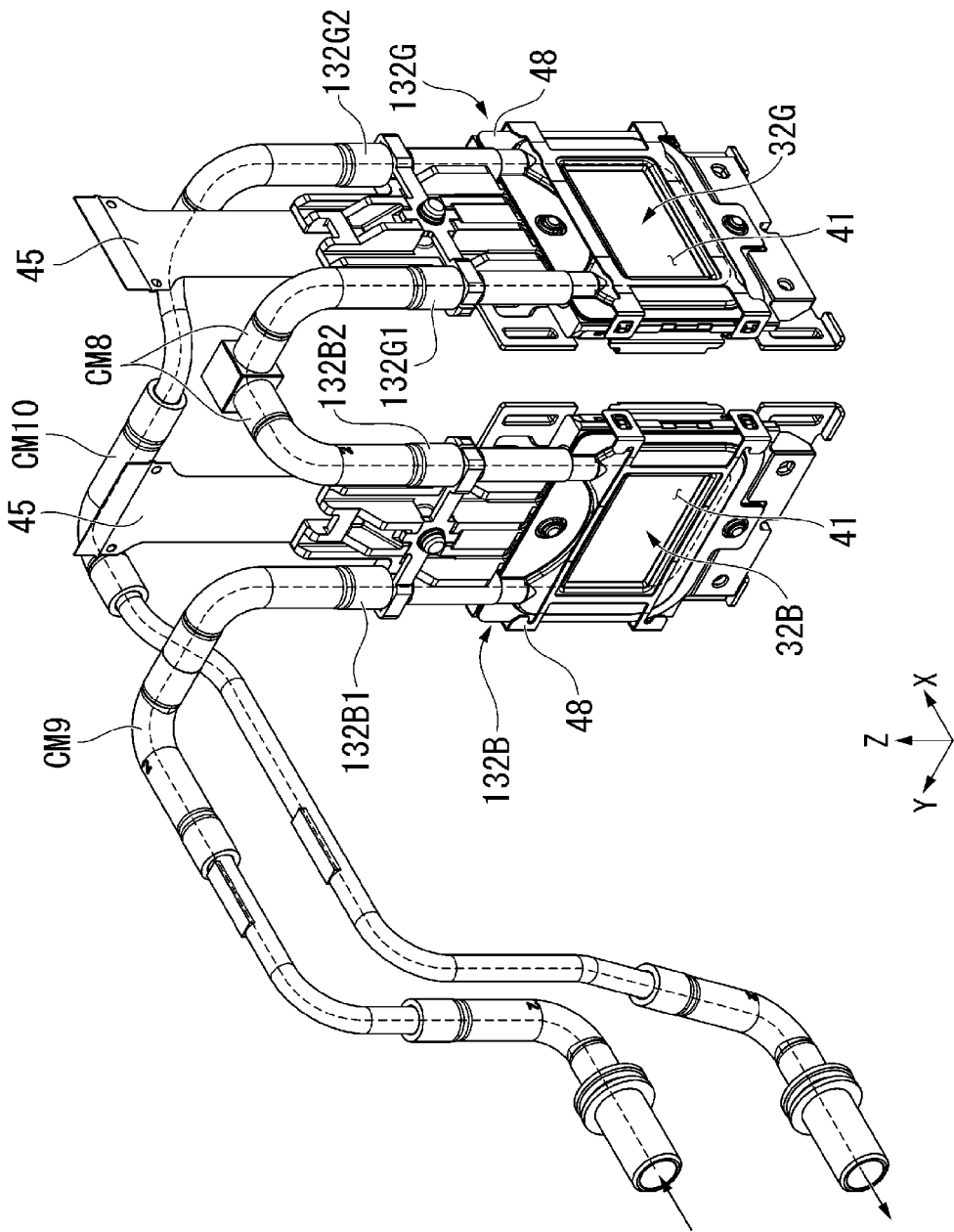
FIG. 8 is a view showing a supply path of the heat exchange liquid between light modulation panels.

FIG. 8 is a view showing a supply path of the heat exchange liquid between the light modulation panel 32G and the light modulation panel 32B.

As shown in FIG. 8, the light modulation panel 32B includes a panel main body 41, a printed circuit board 45 for a flat cable, and a holding case 48. Dust proofing glass (not shown) is provided on both surfaces of the panel main body 41. The liquid cooling device 132B includes a liquid flow path provided in the holding case 48 that holds the panel main body 41 (not shown), and cools the light modulation panel 32B by transferring heat generated by the panel main body 41 to the heat exchange liquid flowing through the liquid flow path.

The liquid cooling device 132B includes an inflow portion 132B1 into which the heat exchange liquid flows and an outflow portion 132B2 that flows the heat exchange liquid out. The heat exchange liquid flows into the inflow portion 132B1 from the outside. The inflow portion 132B1 communicates with the inside of the holding case 48, and the heat exchange liquid flowed into the holding case 48 from the inflow portion 132B1 flows through the liquid flow path toward the outflow portion 132B2. The outflow portion 132B2 communicates with the liquid flow path provided inside the holding case 48, and flows the heat exchange liquid flowed through the liquid flow path to the outside.

The light modulation panel 32G has the same configuration as the light modulation panel 32B. That is, the light modulation panel 32G includes the panel main body 41, the printed circuit board 45 for a flat cable, and the holding case 48. The dust proofing glass (not shown) is provided on both surfaces of the panel main body 41. The liquid cooling device 132G includes a liquid flow path provided in the holding case 48 that holds the panel main body 41 (not shown), and cools the light modulation panel 32G by transferring heat generated by the panel main body 41 to the heat exchange liquid flowing through the liquid flow path.

The liquid cooling device 132G includes an inflow portion 132G1 into which the heat exchange liquid flows and an outflow portion 132G2 that flows the heat exchange liquid out. The heat exchange liquid flows into the inflow portion 132G1 from the outside. The inflow portion 132G1 communicates with the inside of the holding case 48, and the heat exchange liquid flowed into the holding case 48 from the inflow portion 132G1 flows through the liquid flow path toward the outflow portion 132G2. The outflow portion 132G2 communicates with the liquid flow path provided inside the holding case 48, and flows the heat exchange liquid flowed through the liquid flow path to the outside.

The outflow portion 132B2 of the liquid cooling device 132B is coupled to the inflow portion 132G1 of the liquid cooling device 132G via a pipe CM8. Therefore, the heat exchange liquid flowed out from the outflow portion 132B2 of the liquid cooling device 132B flows into the inflow portion 132G1 of the liquid cooling device 132G. Further, as shown by arrows of a dashed line in FIG. 8, the heat exchange liquid flowed into the liquid cooling device 132G flows through the liquid flow path and is discharged from the outflow portion 132G2 of the liquid cooling device 132G.

The inflow portion 132B1 of the liquid cooling device 132B is coupled to a coupling portion JT1 via a pipe CM9. The coupling portion JT1 is coupled to the pipe CM3 coupled to the outlet 83b of the reservoir tank 83, and to the inflow portion 71 of the pipe coupling member 75 in the heat exchanger 7 for panel heat absorption.

Accordingly, the heat exchange liquid cooled by the heat exchanger 8 for panel heat dissipation is supplied to the inflow portion 132B1 of the liquid cooling device 132B through the pipe CM9 and the pipe CM3.

The outflow portion 132G2 of the liquid cooling device 132G is coupled to a coupling portion JT2 via a pipe CM10. The coupling portion JT2 is coupled to the outflow portion 72 of the pipe coupling member 75 in the heat exchanger 7 for panel heat absorption, and to the pipe CM4 coupled to the inflow portion 81 of the pipe coupling member 85 in the heat exchanger 8 for panel heat dissipation. Further, a part of the pipe CM10 is extended to the outside without loss of the sealed state inside the case 10. Accordingly, the heat exchange liquid discharged from the outflow portion 132G2 of the liquid cooling device 132G returns to the heat exchanger 8 for panel heat dissipation from the pipe CM10 through the pipe CM4.

According to the projector 1 of the present embodiment, since the heat absorbed by the liquid cooling device 132B and the liquid cooling device 132G is dissipated by circulating the heat exchange liquid flowed through the liquid cooling device 132B and the liquid cooling device 132G with the heat exchanger 8 for panel heat dissipation, the cooling efficiency in the liquid cooling device 132B and the liquid cooling device 132G can be improved. Therefore, the light modulation panels 32G and 32B can be cooled stably and efficiently.

As shown in FIG. 2, in the present embodiment, the light modulation panel 32R, which has a smaller heat generation amount than those of the light modulation panels 32B and 32G, is cooled by the air flow K supplied from the first fan 16a. That is, in the present embodiment, the first fan 16a functions as an air cooling device of an air-cooling type that cools the light modulation panel 32R by suppling an air flow toward the light modulation panel 32R.

Figure 9:
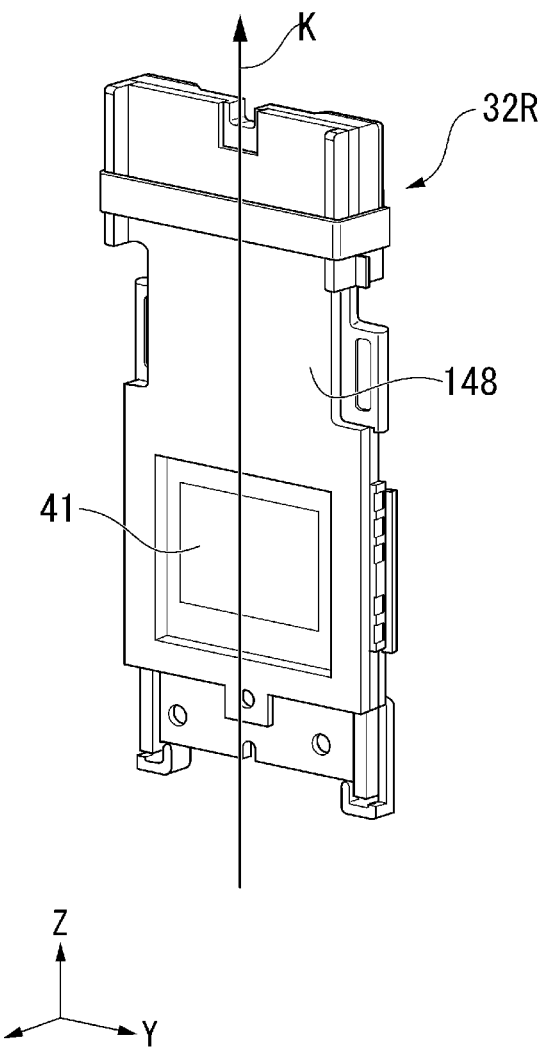
FIG. 9 is a view showing a schematic configuration of a light modulation panel for red.

FIG. 9 is a view showing a schematic configuration of the light modulation panel 32R. FIG. 9 is a perspective view of the light modulation panel 32R when viewed from the light incident side.

As shown in FIG. 9, the light modulation panel 32R according to the present embodiment includes the panel main body 41, a printed circuit board (not shown), and a holding case 148 made of aluminum. The dust proofing glass (not shown) is provided on both surfaces of the panel main body 41. In the light modulation panel 32R, heat generated by the panel main body 41 is transferred to the holding case 148. As shown in FIG. 9, the air flow K supplied from the panel fans 16 shown in FIG. 2 flows to the upper side that is the +Z side along a surface of the holding case 148, and cools the light modulation panel 32R by dissipating the heat transferred from the panel main body 41 to the holding case 148. In addition, a plurality of heat dissipating fins for improving the cooling performance may be provided on the surface of the holding case 148.

That is, the image forming unit 3 according to the present embodiment includes the liquid cooling device 132G that is provided in the light modulation panel 32G and cools the heat generated by the panel main body 41, the liquid cooling device 132B that is provided in the light modulation panel 32B and cools the heat generated by the panel main body 41, and the panel fans 16 that supply the air flow toward the light modulation panel 32R.

As shown in FIGS. 6 and 7, the heat exchanger 9 for light source heat dissipation lowers the temperature of the heat exchange liquid by dissipating the heat absorbed by the heat exchanger 25 for light source heat absorption. In the present embodiment, the heat exchanger 9 for light source heat dissipation is implemented by a radiator. The heat exchanger 9 for light source heat dissipation is a heat exchanger that absorbs heat from an air flow by exchanging heat with the air flow via the heat exchange liquid flowing into the inside thereof. The heat exchange liquid whose temperature is lowered by being cooled by the heat exchanger 9 for light source heat dissipation is supplied to the heat exchanger 25 for light source heat absorption again.

The heat exchanger 9 for light source heat dissipation includes a radiator main body 90 having a flat plate shape, a reservoir tank 93, and a pump 94. A pipe coupling member 95 is attached to an end portion of the radiator main body 90 on the +Y side.

The pipe coupling member 95 includes an inflow portion 91 that flows the heat exchange liquid into the radiator main body 90, and an outflow portion 92 that flows the heat exchange liquid out from the radiator main body 90.

The inflow portion 91 is provided on an upper portion on the +Z side of an end surface of the pipe coupling member 95 on the +X side. The inflow portion 91 communicates with the inside of the radiator main body 90, and the heat exchange liquid flowed into the inflow portion 91 flows into a flow path provided inside the radiator main body 90. The radiator main body 90 exchanges heat between an air flow passing from the +X side to the −X side and the heat exchange liquid flowing through the flow path so as to lower the temperature of the heat exchange liquid. The outflow portion 92 is provided on a lower portion on the −Z side of the end surface of the pipe coupling member 95 on the +X side. The outflow portion 92 communicates with the inside of the radiator main body 90, and flows the heat exchange liquid whose temperature was lowered by flowing through the flow path provided inside to the outside.

In the heat exchanger 9 for light source heat dissipation, the outflow portion 92 of the pipe coupling member 95 is coupled to an inlet 93a of the reservoir tank 93 via a pipe CM5. A pipe CM6 is coupled to an outlet 93b of the reservoir tank 93. The pipe CM5 and the pipe CM6 are bent into a predetermined shape by combining a plurality of pipe members and a plurality of coupling members.

The pump 94 discharges the heat exchange liquid from the outlet 93b of the reservoir tank 93. The heat exchange liquid discharged from the outlet 93b of the reservoir tank 93 flows into the inflow portion 6151 of the first cooling plate 615 in the heat exchanger 25 for light source heat absorption via the pipe CM6.

The outflow portion 6152 of the first cooling plate 615 is coupled to the inflow portion 6251 of the second cooling plate 625 via the pipe CM1.

In the heat exchanger 9 for light source heat dissipation, the inflow portion 91 of the pipe coupling member 95 is coupled to the outflow portion 6252 of the second cooling plate 625 in the heat exchanger 25 for light source heat absorption via a pipe CM7. The pipe CM7 is bent into a predetermined shape by combining a plurality of pipe members and a plurality of coupling members.

Based on such a configuration, the heat exchange liquid discharged from the heat exchanger 25 for light source heat absorption flows into the heat exchanger 9 for light source heat dissipation via the pipe CM7.

In the present embodiment, the pipe CM6 includes a coupling portion T6, and the pipe CM7 includes a coupling portion T7. The coupling portion T6 and the coupling portion T7 are provided in respective portions where the pipes CM6 and CM7 are close to each other and are provided in the vicinity of the heat exchanger 25 for light source heat absorption. The pipe CM6 may be separated into two parts at the coupling portion T6, and the pipe CM7 may be separated into two parts at the coupling portion T7.

The light source unit 2 according to the present embodiment is easily removable from the inside of the exterior housing 5 by separating the pipes CM6 and CM7 into two parts at the coupling portions T6 and T7, respectively. According to this configuration, when a failure occurs in the light source unit 2, the light source unit 2 can be easily repaired by removing and replacing the failed light source unit 2 with a new unit, and thus the maintainability of the projector 1 can be improved.

As shown in FIG. 1, the heat exchanger fans 17 flows the air flow K flowing from the +X side to the −X side to the heat exchanger 9 for light source heat dissipation. At this time, since the heat exchange liquid flowing through the flow path in the radiator main body 90 and the air flow K passing through the radiator main body 90 exchange heat, the temperature of the heat exchange liquid flowing through the flow path in the radiator main body 90 can be lowered. Based on such a configuration, the heat exchanger 9 for light source heat dissipation can dissipate the heat transferred from the heat exchanger 25 for light source heat absorption. The heat exchange liquid cooled by the heat exchanger 9 for light source heat dissipation is supplied from the reservoir tank 93 to the heat exchanger 25 for light source heat absorption by the pump 94 as described above.

According to the projector 1 of the present embodiment, the cooling efficiency of the heat exchanger 25 for light source heat absorption can be improved by circulating the heat exchange liquid between the heat exchanger 25 for light source heat absorption and the heat exchanger 9 for light source heat dissipation. Therefore, the light source portion 20 in the light source unit 2 can be cooled stably and efficiently.

In the present embodiment, the heat exchanger 8 for panel heat dissipation and the heat exchanger 9 for light source heat dissipation overlap with each other in a flow direction from the +X side to the −X side of the air flow K by the heat exchanger fans 17. The heat exchanger 8 for panel heat dissipation and the heat exchanger 9 for light source heat dissipation both having a flat plate shape overlap with each other in a thickness direction of the flat plate.

The exterior housing 5 according to the present embodiment includes the left side surface portion 53 that is an air discharge wall portion formed with the air outlet 53a from which the air flow K flowing through the heat exchanger 8 for panel heat dissipation and the heat exchanger 9 for light source heat dissipation is discharged. The heat exchanger 9 for light source heat dissipation is disposed on a left side surface portion 53 side with respect to the heat exchanger 8 for panel heat dissipation.

In the present embodiment, the air flow K flows from the heat exchanger 8 for panel heat dissipation toward the heat exchanger 9 for light source heat dissipation.

In the present embodiment, a surface area of the heat exchanger 9 for light source heat dissipation is larger than a surface area of the heat exchanger 8 for panel heat dissipation. Here, as shown in FIG. 7, the surface areas of the heat exchanger 9 for light source heat dissipation and the heat exchanger 8 for panel heat dissipation correspond to areas when the radiator main bodies 90 and 80 of the respective heat exchangers are viewed in a plan view from the +X side to the −X side.

A heat exchanging capacity of a heat exchanger depends on a size of a plane area. That is, a heat exchanging capacity of the heat exchanger 9 for light source heat dissipation is larger than a heat exchanging capacity of the heat exchanger 8 for panel heat dissipation.

As described above, the projector 1 according to the present embodiment includes: the exterior housing 5; the light source unit 2; the image forming unit 3 that modulates the illumination light WL from the light source unit 2 according to the image information to generate the image light; the projection optical unit 4 that projects the image light generated by the image forming unit 3; the heat exchanger 25 for light source heat absorption that absorbs the heat generated by the light source unit 2; the heat exchanger 7 for panel heat absorption that absorbs the heat generated in the image forming unit 3; the heat exchanger 9 for light source heat dissipation that dissipates the heat transferred from the heat exchanger 25 for light source heat absorption; the heat exchanger 8 for panel heat dissipation that dissipates the heat transferred from the heat exchanger 7 for panel heat absorption; and the heat exchanger fans 17 that supply the air flow K to the heat exchanger 8 for panel heat dissipation and the heat exchanger 9 for light source heat dissipation. The heat exchanger 8 for panel heat dissipation and the heat exchanger 9 for light source heat dissipation overlap with each other in the flow direction of the air flow K, and the air flow K flows from the heat exchanger 8 for panel heat dissipation toward the heat exchanger 9 for light source heat dissipation.

According to the projector 1 of the present embodiment, the heat exchanger 25 for light source heat absorption and the heat exchanger 8 for panel heat dissipation overlap with each other in the flow direction of the air flow K, and the air flow K flows from the heat exchanger 8 for panel heat dissipation toward the heat exchanger 9 for light source heat dissipation. Therefore, common fans that flow an air flow to the heat exchanger 8 for panel heat dissipation and the heat exchanger 9 for light source heat dissipation can be used. Therefore, it is possible to provide the projector 1 that reduces a size of a device configuration while maintaining the cooling performances of the light source unit 2 and the light modulation panels 32R, 32G and 32B.

In the present embodiment, the exterior housing 5 includes the left side surface portion 53 formed with the air outlets 53a that discharge the air flow K flowed through the heat exchanger 9 for light source heat dissipation and the heat exchanger 8 for panel heat dissipation. The heat exchanger 9 for light source heat dissipation is disposed on the left side surface portion 53 side with respect to the heat exchanger 8 for panel heat dissipation, and the air flow K flows from the heat exchanger 8 for panel heat dissipation toward the heat exchanger 9 for light source heat dissipation.

Here, the temperature of the heat generated by the light source unit 2 is higher than the temperature of the heat generated by the image forming unit 3, and the heat at a high temperature is transferred from the light source unit 2 to the heat exchanger 9 for light source heat dissipation. Therefore, when the air flow K first flows to the heat exchanger 9 for light source heat dissipation, the air flow K heated by the heat exchanger 9 for light source heat dissipation is supplied to the heat exchanger 8 for panel heat dissipation, and thus a cooling effect of the heat exchanger 8 for panel heat dissipation may be reduced. In contrast, in the present embodiment, since the air flow K first flows to the heat exchanger 8 for panel heat dissipation, the cooling efficiency of the light modulation panels 32R, 32G and 32B can be improved.

In the present embodiment, the surface area of the heat exchanger 9 for light source heat dissipation is larger than the surface area of the heat exchanger 8 for panel heat dissipation.

According to this configuration, the heat exchanging capacity of the heat exchanger 9 for light source heat dissipation is larger than the heat exchanging capacity of the heat exchanger 8 for panel heat dissipation. In the present embodiment, as described above, although the air flow K flows through the heat exchanger 8 for panel heat dissipation, the heat exchanging capacity of the heat exchanger 9 for light source heat dissipation is enhanced by increasing the surface area for heat dissipation. Therefore, the heat exchanger 9 for light source heat dissipation can efficiently lower the temperature of the heat exchange liquid by satisfactorily exchanging heat with the air flow K passing through the heat exchanger 8 for panel heat dissipation and having a slightly increased temperature.

In the present embodiment, the image forming unit 3, the heat exchanger 9 for light source heat dissipation and the heat exchanger 8 for panel heat dissipation are arranged in one direction in the exterior housing 5, and the exterior housing 5 includes the air inlet 51b, the air inlet 52a, the air inlet 56a, and the air inlet 56b facing the space between the heat exchanger 8 for panel heat dissipation located on the image forming unit 3 side, of the heat exchanger 9 for light source heat dissipation and the heat exchanger 8 for panel heat dissipation, and the image forming unit 3.

According to this configuration, the air flow K can be efficiently introduced into the exterior housing 5 via the air inlet 51*b*, the air inlet 52*a*, the air inlet 56*a*, and the air inlet 56*b*. Accordingly, the cooling efficiency of the heat exchanger 8 for panel heat dissipation and the heat exchanger 9 for light source heat dissipation can be improved.

In the present embodiment, the exterior housing 5 includes the air inlet 56*b* facing the space between the heat exchanger 9 for light source heat dissipation and the heat exchanger 8 for panel heat dissipation.

In the present embodiment, the air inlet 51*b* and the air inlet 52*a* extend to positions facing the space between the heat exchanger 8 for light source heat dissipation and the heat exchanger 9 for panel heat dissipation.

According to this configuration, the air flow K can be directly introduced to the heat exchanger 9 for light source heat dissipation via the air inlets 51*b*, 52*a*, and 56*b*. Accordingly, since the air flow K having a lower temperature is supplied by the heat exchanger 9 for light source heat dissipation, the cooling efficiency of the heat exchanger 9 for light source heat dissipation can be further improved.

In the present embodiment, the heat exchanger 9 for light source heat dissipation and the heat exchanger 8 for panel heat dissipation have the flat plate shape, and the heat exchanger 9 for light source heat dissipation and the heat exchanger 8 for panel heat dissipation overlap with each other in the thickness direction of the flat plate.

According to this configuration, the housing space of the heat exchanger 9 for light source heat dissipation and the heat exchanger 8 for panel heat dissipation is reduced in size by overlapping the heat exchanger 9 for light source heat dissipation and the heat exchanger 8 for panel heat dissipation in the thickness direction, and thus the projector itself can be miniaturized.

The cooling device 6 according to the present embodiment includes the light source unit 2 and the light modulation panels 32R, 32G and 32B disposed in the exterior housing 5, the heat exchanger 25 for light source heat absorption that absorbs the heat generated by the light source unit 2, the heat exchanger 7 for panel heat absorption that absorbs the heat generated by the light modulation panels 32R, 32G and 32B, the heat exchanger 9 for light source heat dissipation that dissipates the heat transferred from the heat exchanger 25 for light source heat absorption, the heat exchanger 8 for panel heat dissipation that dissipates the heat transferred from the heat exchanger 7 for panel heat absorption, and the heat exchanger fans 17 that supply an air flow to the heat exchanger 8 for panel heat dissipation and the heat exchanger 9 for light source heat dissipation. The heat exchanger 8 for panel heat dissipation and the heat exchanger 9 for light source heat dissipation overlap with each other in the flow direction of the air flow K, and the air flow K flows from the heat exchanger 8 for panel heat dissipation toward the heat exchanger 9 for light source heat dissipation.

According to the cooling device 6 of the present embodiment, the heat exchanger 25 for light source heat absorption and the heat exchanger 8 for panel heat dissipation overlap with each other in the flow direction of the air flow K, the air flow K flows from the heat exchanger 8 for panel heat dissipation to the heat exchanger 9 for light source heat dissipation, and thus common fans that flow an air flow to the heat exchanger 8 for panel heat dissipation and the heat exchanger 9 for light source heat dissipation can be used.

Therefore, it is possible to provide a cooling device that is compact while maintaining the cooling performances of the light source unit 2 and the light modulation panels 32R, 32G and 32B. Therefore, the projector 1 provided with the cooling device 6 according to the present embodiment can reduce the size of the device configuration while maintaining the cooling performances of the light source unit 2 and the light modulation panels 32R, 32G and 32B as described above.

In the present embodiment, the heat exchanger 9 for light source heat dissipation and the heat exchanger 8 for panel heat dissipation have the flat plate shape, and the heat exchanger 9 for light source heat dissipation and the heat exchanger 8 for panel heat dissipation overlap with each other in the thickness direction of the flat plate.

According to this configuration, the cooling device 6 can be further miniaturized by overlapping the heat exchanger 9 for light source heat dissipation and the heat exchanger 8 for panel heat dissipation in the thickness direction.

Further, according to the projector 1 of the present embodiment, the highly exothermic light modulation panel 32G for green and the light modulation panel 32B for blue that is necessary to be improved in the light resistance can be efficiently cooled by the liquid cooling devices 132G and 132B. Accordingly, a working lifetime of the light modulation panel 32B can be increased, and the temperature increase of the light modulation panel 32G can be prevented.

As shown in FIG. 8, in the present embodiment, since the outflow portion 132B2 of the liquid cooling device 132B and the inflow portion 132G1 of the liquid cooling device 132G are coupled in series via the pipe CM8, the number of pipes to be extended to the outside of the case 10 can be reduced as compared to a case where the pipes are individually coupled to the liquid cooling devices 132B and 132G. Therefore, the inside of the case 10 can be maintained in a highly sealed state.

Further, according to the projector 1 of the present embodiment, in the exterior housing 5, the light source unit 2 is disposed on the right side that is the +X side of the left-right direction X intersecting the optical axis AX1 of the projection optical unit 4 with respect to the image forming unit 3, and in the exterior housing 5, the heat exchanger 8 for panel heat dissipation is disposed on the left side as the −X side of the left-right direction X with respect to the image forming unit 3.

According to the projector 1 of the present embodiment, the light modulation panels 32R, 32G and 32B can be efficiently cooled by a sealed circulation manner in which the flow of air flow K to circulates from the light modulation panels 32R, 32G, and 32B to the heat exchanger 7 for panel heat absorption in the case 10 of the image forming unit 3.

The projector 1 according to the present embodiment adopts a layout in which the light source unit 2 is disposed on the right side of the image forming unit 3, and the heat exchanger 8 for panel heat dissipation is disposed on the left side of the image forming unit 3 in the exterior housing 5, so that the sizes of the projector 1 in the front-rear direction Y and the up-down direction Z can be reduced while maintaining the cooling performances of the light modulation panels 32R, 32G and 32B.

In the present embodiment, the heat exchanger 7 for panel heat absorption partitions the case 10 of the image forming unit 3 into the housing portion for the image forming portion 3A on the +Y side and the housing portion for the panel fans 16 on the −Y side.

According to this configuration, since the air flow K heated by the light modulation panels 32R, 32G, and 32B is efficiently introduced to the heat exchanger 7 for panel heat absorption, the heat can be absorbed from the air flow K.

In the present embodiment, the three fans 16a, 16b and 16c as the panel fans 16 are arranged along the heat exchanger 7 for panel heat absorption, the air flow K from each of the fans 16a, 16b, and 16c flows respectively to the light modulation panels 32R, 32G, and 32B via the heat exchanger 7 for panel heat absorption and the ducts 15 provided between the image forming portion 3A and the exterior housing 5.

By providing a plurality of panel fans 16 in this way, a flow rate in each of the fans 16a, 16b, and 16c can be reduced. Therefore, it is possible to use the panel fans 16 that have a reduced outer shape at least in the front-rear direction Y, and thus the size of the projector 1 in the front-rear direction Y can be reduced. In the case of using the panel fans 16, when the panel fans 16a, 16b, 16c are disposed along the heat exchanger 7 for panel heat absorption, it is possible to prevent the increase in size of the projector 1 in the front-rear direction Y. In addition, the air flow K can be efficiently supplied to the light modulation panels 32R, 32G and 32B of the image forming portion 3A via the ducts 15, and the cooling performances of the panels can be improved.

In the present embodiment, the ducts 15 include the first duct portion 15a that flows the air flow K from the first fan 16a to the light modulation panel 32R, the second duct portion 15b that flows the air flow K from the second fan 16b to the light modulation panel 32G, and the third duct portion 15c that flows the air flow K from the third fan 16c to the light modulation panel 32B.

According to this configuration, since the air flows from the individual fans are supplied to the light modulation panels 32R, 32G, and 32B, the cooling performances of the light modulation panels 32R, 32G, and 32B can be improved.

In the present embodiment, the image forming portion 3A, the heat exchanger 7 for panel heat absorption and the panel fans 16 are arranged in the front-rear direction Y in the case 10 of the image forming unit 3, and the heat exchanger 8 for panel heat dissipation extends along the front-rear direction Y.

According to this configuration, it is possible to prevent the increase in size of the projector 1 in the left-right direction X while maintaining the cooling performance of the image forming unit 3 by ensuring a heat dissipation area of the heat exchanger 8 for panel heat dissipation in the front-rear direction Y.

The projector 1 according to the present embodiment further includes the heat exchanger 25 for light source heat absorption that absorbs the heat from the light source unit 2, and the heat exchanger 9 for light source heat dissipation that dissipate the heat absorbed by the heat exchanger 25 for light source heat absorption. The heat exchanger 9 for light source heat dissipation is disposed on the left side in the left-right direction X with respect to the image forming unit 3 in the exterior housing 5.

According to this configuration, the cooling performance of the light source unit 2 can be improved by efficiently dissipating the heat generated by the light source unit 2. Therefore, the light source unit 2 can be driven stably. Further, the heat exchanger 8 for panel heat dissipation and the heat exchanger 9 for light source heat dissipation can be disposed on the left side as the −X side opposite to the light source unit 2 in the exterior housing 5. Accordingly, the large air outlet 53a for discharging exhaust heat of the heat exchanger 8 for panel heat dissipation and the heat exchanger 9 for light source heat dissipation can be ensured, and thus the cooling efficiency of the light source unit 2 and the panels can be improved.

In the present embodiment, the exterior housing 5 includes the air inlets 51b, 52a, and 56a facing the space between the image forming unit 3 and the heat exchanger 8 for panel heat dissipation, and the air outlet 53a that faces the heat exchanger 8 for panel heat dissipation. The air flow K introduced from the air inlets 51b, 52a, and 56a by the heat exchanger fans 17 flows to the air outlet 53a through the heat exchanger 8 for panel heat dissipation.

According to this configuration, the air flow K can be directly introduced from the air inlets 51b, 52a, and 56a to the heat exchanger 8 for panel heat dissipation, and thus the cooling efficiency of the heat exchanger 8 for panel heat dissipation can be improved.

In the present embodiment, the power supply unit 14 that supplies the power to the light source unit 2 and the image forming portion 3A is disposed on the right side of the image forming unit 3 in the exterior housing 5. The power supply unit 14 is disposed in the exterior housing 5 in a manner of overlapping with at least a part of the light source unit 2 in the up-down direction Z.

According to this configuration, since the power supply unit 14 and the light source unit 2 are located on the same side with respect to the image forming unit 3 in the exterior housing 5, the routing of the wiring is easy by shortening a wiring path from the power supply unit 14 to the image forming portion 3A and the light source unit 2. In addition, since the power supply unit 14 is not disposed on the heat exchanger 8 for panel heat dissipation side, it is possible to prevent the occurrence of problems such as a decrease in the cooling efficiency of the heat exchanger 8 for panel heat dissipation due to the heat generated by the power supply unit 14.

Second Embodiment

A projector according to a second embodiment will be described.

The projector according to the present embodiment is different from the first embodiment in that the liquid cooling device 132B is provided only at the light modulation panel 32B. The same reference numerals are attached to configurations and members common to those of the first embodiment, and the description thereof will be omitted.

Hereinafter, a configuration of the light modulation panel 32B that is a feature of the present embodiment will be described. In the present embodiment, the light modulation panels 32G and 32R are cooled by air flows supplied from the panel fans 16 (see FIG. 2). Therefore, the light modulation panel 32G according to the present embodiment has the same configuration as the light modulation panel 32R shown in FIG. 9.

Figure 10:
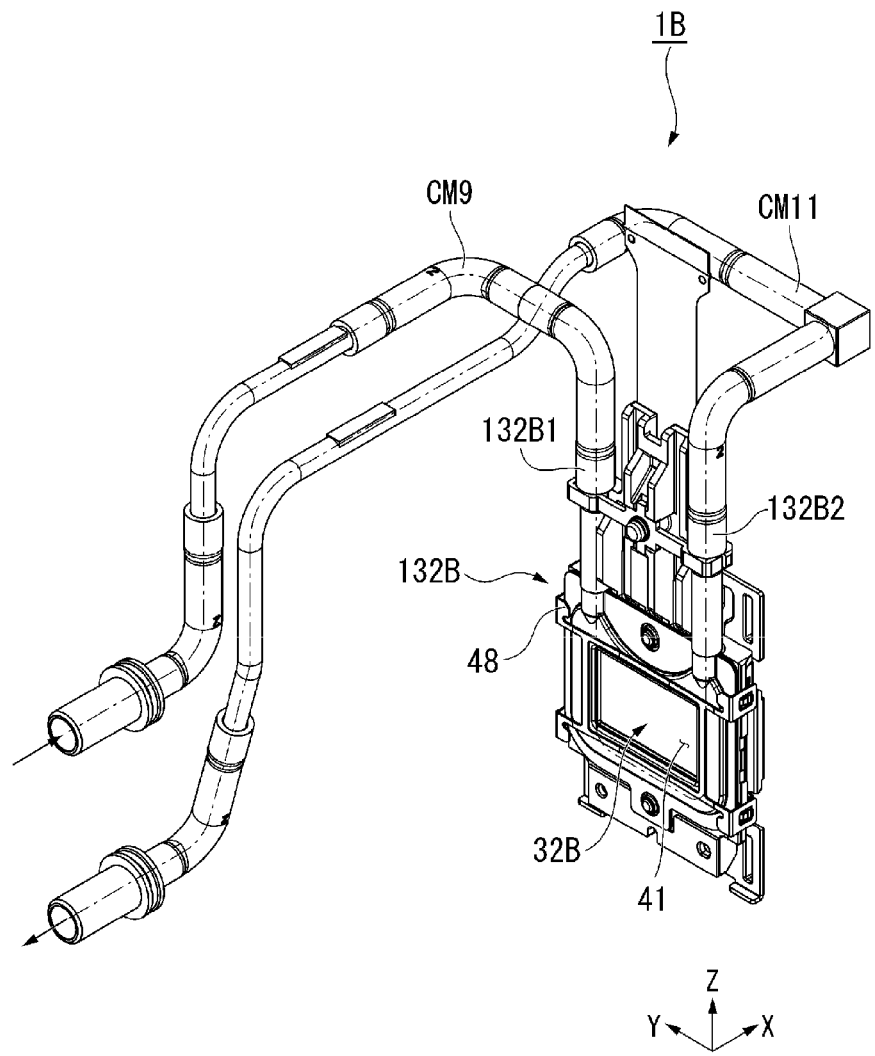
FIG. 10 is a view showing a path of a heat exchange liquid in a light modulation panel according to a second embodiment.

FIG. 10 is a view showing the path of the heat exchange liquid in the light modulation panel 32B that is a main part of a projector 1B according to the present embodiment.

As shown in FIG. 10, in the light modulation panel 32B according to the present embodiment, the inflow portion 132B1 of the liquid cooling device 132B is coupled to the coupling portion JT1 shown in FIGS. 6 and 7 via the pipe CM9. The coupling portion JT1 is coupled to the pipe CM3 coupled to the outlet 83b of the reservoir tank 83, and to the inflow portion 71 of the pipe coupling member 75 in the heat exchanger 7 for panel heat absorption. Further, a part of the pipe CM9 is extended to the outside without loss of the sealed state inside the case 10. Accordingly, the heat exchange liquid cooled by the heat exchanger 8 for panel heat dissipation is supplied to the inflow portion 132B1 of the liquid cooling device 132B through the pipe CM9 and the pipe CM3.

The outflow portion 132B2 of the liquid cooling device 132B is coupled to the coupling portion JT2 shown in FIGS. 6 and 7 via a pipe CM11. The coupling portion JT2 is coupled to the outflow portion 72 of the pipe coupling member 75 in the heat exchanger 7 for panel heat absorption, and to the pipe CM4 coupled to the inflow portion 81 of the heat exchanger 8 for panel heat dissipation (pipe coupling member 85). That is, in the present embodiment, the pipe CM10 shown in FIGS. 6 and 7 is replaced with the pipe CM11. Further, a part of the pipe CM11 is extended to the outside without loss of the sealed state inside the case 10. Accordingly, the heat exchange liquid discharged from the outflow portion 132B2 of the liquid cooling device 132B returns to the heat exchanger 8 for panel heat dissipation from the pipe CM11 via the pipe CM4.

According to present embodiment, since the heat absorbed by the liquid cooling device 132B is dissipated by circulating the heat exchange liquid flowed through the liquid cooling device 132B with the heat exchanger 8 for panel heat dissipation, the cooling efficiency of the liquid cooling device 132B can be improved. Therefore, the light modulation panel 32B can be cooled stably and efficiently. In addition, the light modulation panel 32G and the light modulation panel 32R are cooled by the air flow K from the panel fans 16.

According to the projector 1B of the present embodiment, of the light modulation panels 32G and 32B, the light modulation panel 32B on which high-energy light is incident is efficiently cooled by the liquid cooling device 132B, and thus the working lifetime of the light modulation panel 32B can be increased. Further, since the number of liquid cooling devices 132B is one, a risk of liquid leakage from coupling portions of pipes can be minimized by reducing the number of pipes.

Third Embodiment

A projector according to a third embodiment will be described.

The present embodiment is different from the configuration of the second embodiment in that the light modulation panel 32G is cooled by a vapor chamber. In the present embodiment, the light modulation panel 32B is cooled by the liquid cooling device 132B, the light modulation panel 32G is cooled by the vapor chamber to be described later, and the light modulation panel 32R is cooled by the air flow from the panel fans 16. The same reference numerals are attached to configurations and members common to those of the above embodiments, and the description thereof will be omitted.

Hereinafter, a configuration of the light modulation panel 32G that is a feature of the present embodiment will be described, and descriptions on configurations of the light modulation panels 32R and 32B will be omitted.

Figure 11:
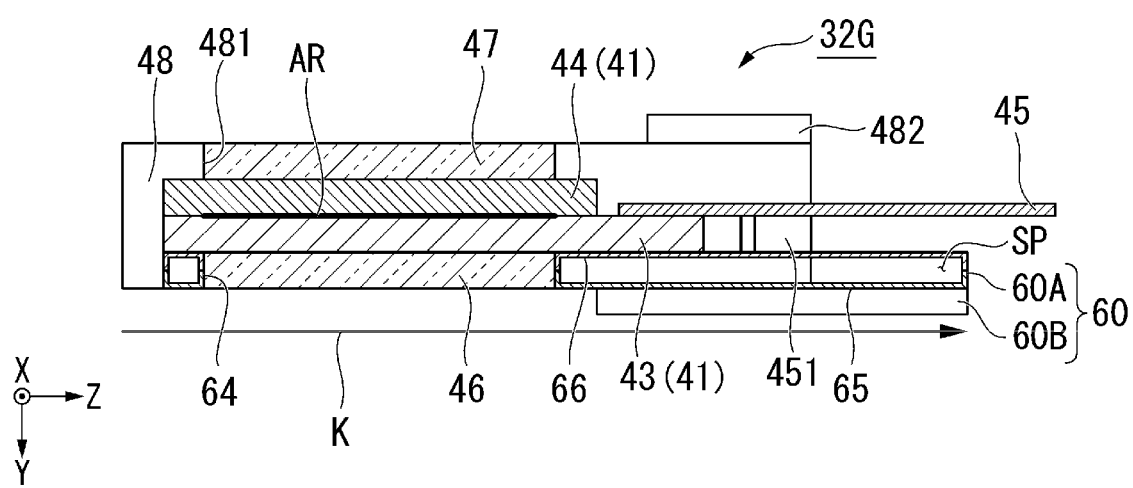
FIG. 11 is a cross-sectional view showing a configuration of a light modulation panel.

FIG. 11 is a cross-sectional view showing the configuration of the light modulation panel 32G.

As shown in FIG. 11, the light modulation panel 32G includes the panel main body 41, the printed circuit board 45 for a flat cable, a first dust proofing member 46, a second dust proofing member 47 and the holding case 48. A vapor chamber 60 includes a heat receiving portion 66 that receives heat generated in the light modulation panel 32G and a heat dissipating portion 65 that dissipates the heat received by the heat receiving portion 66. The vapor chamber 60 is a cooling member that vaporizes a liquid refrigerant by heat from the heat receiving portion 66 and condenses the refrigerant by the heat dissipation from the heat dissipating portion 65 so as to cool the light modulation panel 32G.

As shown in FIG. 11, the panel main body 41 includes a first substrate 43, a second substrate 44, and a liquid crystal layer (not shown) sandwiched between the first substrate 43 and the second substrate 44.

The first substrate 43 is disposed on a light emitting side of the panel main body 41 that is the +Y side, and the second substrate 44 is disposed on a light incident side of the panel main body 41 that is the −Y side. In the present embodiment, the first substrate 43 is an element substrate provided with a plurality of switching elements such as thin film transistors (TFT), and the second substrate 44 is a counter substrate provided with a common electrode. The first substrate 43 and the second substrate 44 are substrates having a light transmitting property that are capable of transmitting light. Based on such a configuration, the panel main body 41 can modulate light according to a voltage applied to pixels of a pixel forming region AR formed between the first substrate 43 and the second substrate 44.

The printed circuit board 45 extends from the first substrate 43 and the second substrate 44 to the upper side that is the +Z side, and is coupled to a control device (not shown). The printed circuit board 45 drives the panel main body 41 according to an image signal received from the control device. The printed circuit board 45 includes a driver circuit 451 that controls an operation of the panel main body 41.

The driver circuit 451 is a circuit element provided on the printed circuit board 45. The driver circuit 451 is installed on a surface of the printed circuit board 45 on the light emitting side that is the +Y side. The surface of the driver circuit 451 on the light emitting side is thermally coupled to the vapor chamber 60 that functions as a cooling member.

Here, the thermal coupling between the driver circuit 451 and the vapor chamber 60 means that the driver circuit 451 and the vapor chamber 60 are coupled to each other in a state in which heat of the driver circuit 451 can be transferred to the vapor chamber 60. The driver circuit 451 and the vapor chamber 60 may be in direct contact with each other, or may be in indirect contact with each other via a thermal conduction member sandwiched therebetween.

The first dust proofing member 46 is provided in a portion corresponding to the pixel forming region AR on a surface of the first substrate 43 on the light emitting side that is the +Y side. That is, when the panel main body 41 is viewed in a plan view from the light emitting side that is the +Y side, the first dust proofing member 46 covers the pixel forming region AR. The first dust proofing member 46 is fitted in an opening 64 of the vapor chamber 60.

The second dust proofing member 47 is provided in a portion corresponding to the pixel forming region AR on a surface of the second substrate 44 on the light incident side that is the −Y side. That is, when the panel main body 41 is viewed in a plan view from the light incident side that is the −Y side, the second dust proofing member 47 covers the pixel forming region AR. The second dust proofing member 47 is fitted in an opening 481 of the holding case 48.

The first dust proofing member 46 and the second dust proofing member 47 are substantially rectangular-shaped substrates having a light transmitting property. The first dust proofing member 46 and the second dust proofing member 47 prevent the adhesion of dust to the panel main body 41, and prevent light modulated by the panel main body 41 from including a shadow of the dust.

The opening 481 allows light emitted from the incident side polarizing plate (not shown) to pass therethrough and to be incident on the second dust proofing member 47. The heat dissipating member 482 is provided at a part on the +Z side with respect to the opening 481, and includes a plurality of fins protruding toward the light incident side that is the −Y side. The heat dissipating member 482 dissipates heat transferred from the first substrate 43 and the second dust proofing member 47 to the holding case 48.

The vapor chamber 60 is disposed on a side opposite to the second substrate 44 with respect to the first substrate 43, and is thermally coupled to the first substrate 43. The vapor chamber 60 includes a main body portion 60A and a heat dissipating member 60B.

Figure 12:
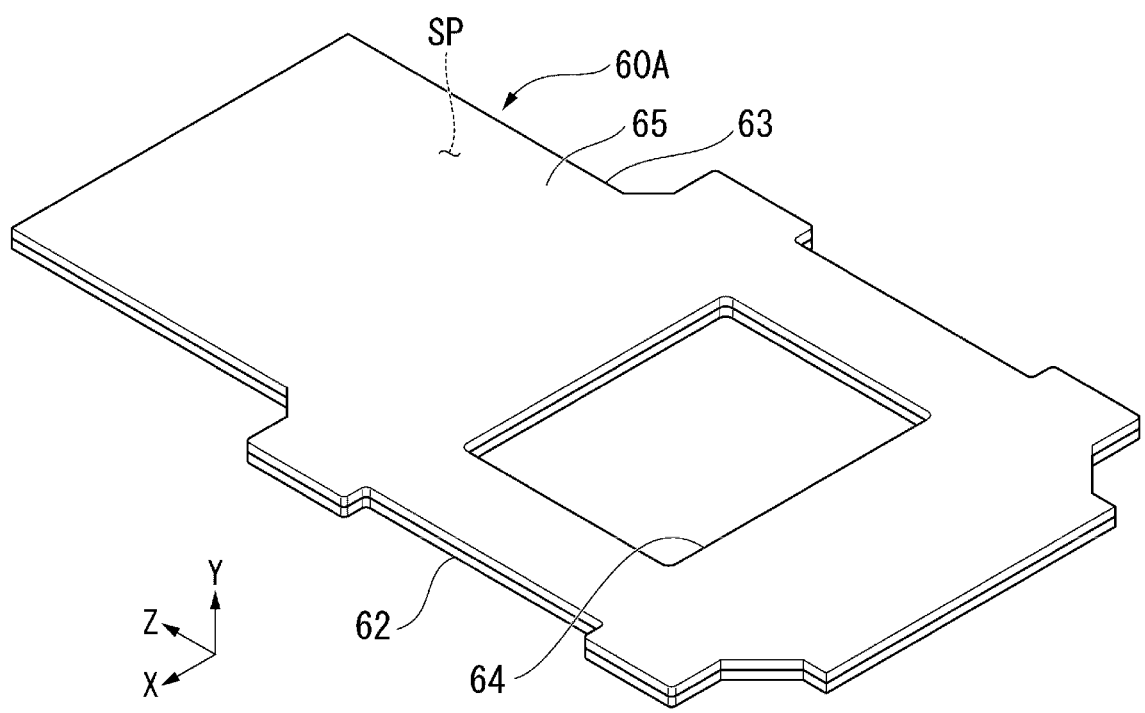
FIG. 12 is a perspective view showing a main body portion.

FIG. 12 is a perspective view showing the main body portion 60A.

As shown in FIG. 12, the main body portion 60A includes a heat receiving substrate 62 disposed on the light incident side that is the −Y side and a heat dissipating substrate 63 disposed on the light emitting side that is the +Y side, and is formed by combining the heat receiving substrate 62 and the heat dissipating substrate 63. As shown in FIG. 11, a hollow space SP in which a working fluid is sealed is defined inside the main body portion 60A.

Figure 13:
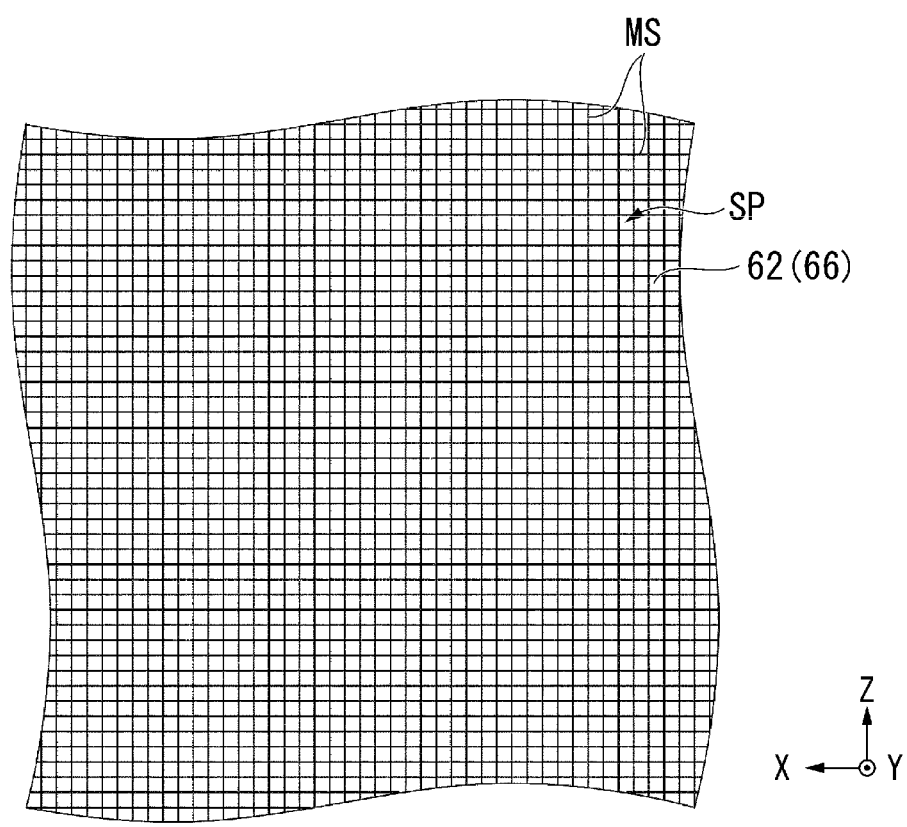
FIG. 13 is a schematic diagram showing an inner surface of a heat receiving substrate.

FIG. 13 is a schematic diagram showing an inner surface of the heat receiving substrate 62 that faces the heat dissipating substrate 63.

The heat receiving substrate 62 includes the heat receiving portion 66 that is coupled to the first substrate 43 of the panel main body 41 and changes the working fluid in a liquid phase into the working fluid in a gas phase by heat transferred from the panel main body 41.

Specifically, the heat receiving portion 66 of the heat receiving substrate 62 has a mesh structure MS provided in the hollow space SP. As shown in FIG. 13, the mesh structure MS is provided on a surface of the heat receiving substrate 62 which faces the heat dissipating substrate 63.

The mesh structure MS is impregnated with the liquid refrigerant sealed in the depressurized hollow space SP, and the mesh structure MS transports the impregnated liquid refrigerant to a part of the heat receiving substrate 62 where the heat is transferred from the outside.

The heat receiving substrate 62 vaporizes the liquid refrigerant by the heat transferred from the outside, for example, the heat transferred from the panel main body 41 and the first dust proofing member 46. That is, the heat receiving substrate 62 evaporates the liquid refrigerant by the transferred heat. The refrigerant that was changed to a gas in this way flows through a flow path formed on an inner surface of the heat dissipating substrate 63.

The heat dissipating substrate 63 is formed in a flat plate shape similar to the heat receiving substrate 62.

As shown in FIGS. 12 and 13, the main body portion 60A includes the opening 64 and the heat dissipating portion 65.

The opening 64 is a substantially rectangular-shaped opening that penetrates the main body portion 60A in a thickness direction. The first dust proofing member 46 is fitted inside the opening 64. That is, an inner edge of the opening 64 and a side surface of the first dust proofing member 46 are thermally coupled. Accordingly, the heat transferred from the panel main body 41 to the first dust proofing member 46 is transferred to the heat receiving portion 66 of the heat receiving substrate 62, a part of the liquid refrigerant sealed in the hollow space SP is converted into a gaseous refrigerant, and the heat transferred to the heat receiving portion 66 of the heat receiving substrate 62 is consumed.

The heat dissipating portion 65 condenses the gaseous refrigerant into the liquid refrigerant by dissipating heat of the gaseous refrigerant flowing in the hollow space SP. The heat dissipating portion 65 is provided on the heat dissipating substrate 63 and is located on the +Z side with respect to the opening 64. The heat dissipating member 60B is provided on a part of an outer surface of the heat dissipating substrate 63 that corresponds to the heat dissipating portion 65. The heat dissipating member 60B dissipates the heat transferred from the gaseous refrigerant. The heat dissipating portion 65 easily dissipates the heat transferred from the gaseous refrigerant by being provided with the heat dissipating member 60B.

As shown in FIG. 11, regarding at least a part of the air flow K supplied from the panel fans 16, the air flow K flows in the space on the +Y side with respect to the light modulation panel 32G from the −Z side to the +Z side. The air flow K cools the first dust proofing member 46. Since the heat of the panel main body 41 is transferred to the first dust proofing member 46 via the first substrate 43, a part of the heat of the panel main body 41 is dissipated by the air flow K flowing to the first dust proofing member 46. The air flow K that cooled the first dust proofing member 46 flows through the heat dissipating portion 65 provided with the heat dissipating member 60B to the +Z side.

Based on such a configuration, the vapor chamber 60 can cool the panel main body 41 by vaporization heat when the liquid refrigerant is changed to the gaseous refrigerant by the heat transferred from the panel main body 41 to the heat receiving portion 66 via the first substrate 43 and the first dust proofing member 46.

In the present embodiment, as shown in FIG. 11, the heat dissipating portion 65 of the vapor chamber 60 is located downstream of the air flow K flowing from the second fan 16b shown in FIG. 2 to the light modulation panel 32G.

According to this configuration, since the air flow K cools the panel main body 41 first, the evaporation of the refrigerant can be promoted in the vapor chamber 60 as compared with the case where the air flow K cools the heat dissipating portion 65 first. Therefore, the cooling performance of the vapor chamber 60 can be improved.

Further, in the vapor chamber 60 according to the present embodiment, the heat dissipating portion 65 is provided on the +Z side with respect to the opening 64. In the present embodiment, since the +Z side corresponds to a direction indicating an upper side of a vertical direction, the liquid refrigerant condensed by the heat dissipating portion 65 can be easily transported toward a coupling portion with the first substrate 43 and a coupling portion with the first dust proofing member 46 of the heat receiving substrate 62 due to not only a capillary force generated by the mesh structure MS but also the gravity. Accordingly, it is possible to promote a state change of the refrigerant from liquid to gas on the heat receiving substrate 62 by the heat transferred from the panel main body 41. That is, heat dissipation efficiency of the panel main body 41 can be improved, and further cooling efficiency of the panel main body 41 can be improved.

Here, the vapor chamber 60 does not require a liquid flow path of a liquid-cooling type, an electric drive, or the like. According to the projector of the present embodiment, since the light modulation panel 32G is cooled by the vapor chamber 60, the light modulation panel 32G can be efficiently cooled without increasing the number of pipes for providing the liquid flow path. Therefore, the light modulation panels 32R, 32G, and 32B can be cooled stably and efficiently while minimizing the risk of liquid leakage.

Fourth Embodiment

A projector according to a fourth embodiment will be described.

The projector according to the present embodiment is different from the first embodiment in that the liquid cooling device 132G is provided only at the light modulation panel 32G. The same reference numerals are attached to configurations and members common to those of the first embodiment, and the description thereof will be omitted.

Hereinafter, a configuration of the light modulation panel 32G that is a feature of the present embodiment will be described. In the present embodiment, the light modulation panels 32B and 32R are cooled by air flows supplied from the panel fans 16 shown in FIG. 2. Therefore, the light modulation panel 32B according to the present embodiment has the same configuration as the light modulation panel 32R shown in FIG. 9.

Figure 14:
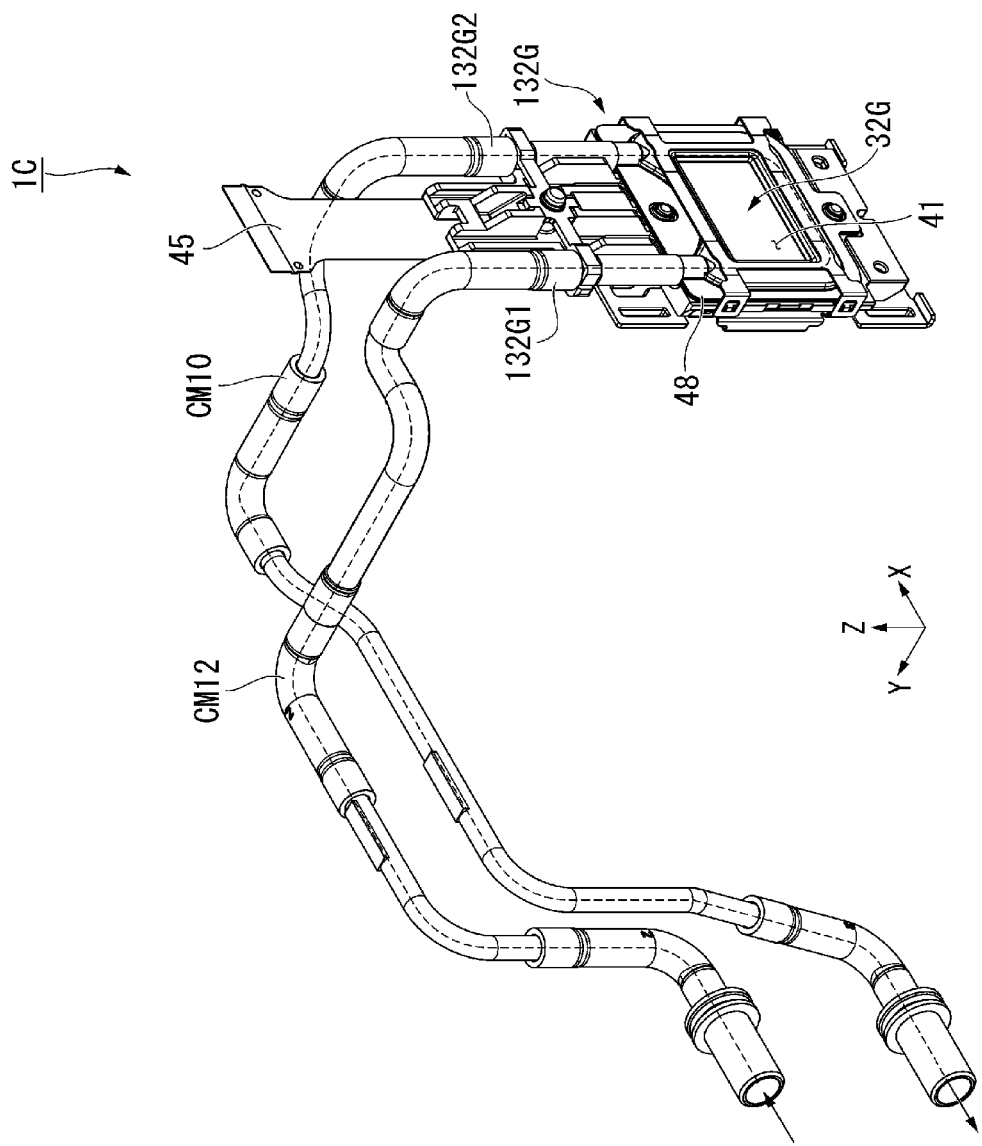
FIG. 14 is a view showing a path of a heat exchange liquid in a light modulation panel according to a fourth embodiment.

FIG. 14 is a view showing the path of the heat exchange liquid in the light modulation panel 32G that is a main part of a projector 1C according to the present embodiment.

As shown in FIG. 14, in the light modulation panel 32G according to the present embodiment, the inflow portion 132G1 of the liquid cooling device 132G is coupled to the coupling portion JT1 shown in FIGS. 6 and 7 via a pipe CM12. The coupling portion JT1 is coupled to the pipe CM3 coupled to the outlet 83b of the reservoir tank 83, and to the inflow portion 71 of the pipe coupling member 75 in the heat exchanger 7 for panel heat absorption. In the present embodiment, the pipe CM9 shown in FIGS. 6 and 7 is replaced with the pipe CM12. Further, a part of the pipe CM12 is extended to the outside without loss of the sealed state inside the case 10. Accordingly, the heat exchange liquid cooled by the heat exchanger 8 for panel heat dissipation is supplied to the inflow portion 132G1 of the liquid cooling device 132G through the pipe CM12 and the pipe CM3.

The outflow portion 132G2 of the liquid cooling device 132G is coupled to the coupling portion JT2 shown in FIGS. 6 and 7 via the pipe CM10. The coupling portion JT2 is coupled to the outflow portion 72 of the pipe coupling member 75 in the heat exchanger 7 for panel heat absorption, and to the pipe CM4 coupled to the inflow portion 81 of the pipe coupling member 85 in the heat exchanger 8 for panel heat dissipation. Accordingly, the heat exchange liquid discharged from the outflow portion 132G2 of the liquid cooling device 132G returns to the heat exchanger 8 for panel heat dissipation from the pipe CM10 through the pipe CM4.

According to present embodiment, since the heat absorbed by the liquid cooling device 132G is dissipated by circulating the heat exchange liquid flowed through the liquid cooling device 132G with the heat exchanger 8 for panel heat dissipation, the cooling efficiency in the liquid cooling device 132G can be improved. Therefore, the light modulation panel 32G can be cooled stably and efficiently. In addition, the light modulation panel 32B and the light modulation panel 32R are cooled by the air flow K from the panel fans 16.

According to the projector 1C of the present embodiment, of the light modulation panels 32G and 32B, the light modulation panel 32G whose temperature is high can be efficiently cooled by the liquid cooling device 132B, and thus the temperature increase of the light modulation panel 32G can be prevented. Further, since the number of liquid cooling devices 132G is one, the risk of liquid leakage from coupling portions of pipes can be minimized by reducing the number of pipes.

Fifth Embodiment

A projector according to a fifth embodiment will be described.

The present embodiment is different from the configuration of the first embodiment in that the light modulation panel 32B is cooled by a vapor chamber. In the present embodiment, the light modulation panel 32B is cooled by the vapor chamber, the light modulation panel 32G is cooled by the liquid cooling device 132G, and the light modulation panel 32R is cooled by air flows from the panel fans 16. Therefore, the light modulation panel 32B according to the present embodiment has the same configuration as the light modulation panel 32G shown in FIGS. 11 to 13.

According to the projector of the present embodiment, the temperature increase of the light modulation panel 32G can be prevented while minimizing the risk of liquid leakage by only cooling the light modulation panel 32G with the liquid cooling device 132G. Further, since the light modulation panel 32B is cooled by the vapor chamber, the working lifetime thereof can be increased by efficiently cooling the light modulation panel 32B without increasing the number of pipes for providing the liquid flow path.

Sixth Embodiment

A projector according to a sixth embodiment will be described.

The present embodiment is different from the configuration of the fifth embodiment in that the light modulation panel 32R is cooled by a vapor chamber. In the present embodiment, the light modulation panels 32B and 32R are cooled by vapor chambers, the light modulation panel 32G is cooled by the liquid cooling device 132G. Therefore, the light modulation panel 32R according to the present embodiment has the same configuration as the light modulation panel 32G shown in FIGS. 11 to 13.

The projector according to the present embodiment includes the light modulation panel 32R, the light modulation panel 32G, the light modulation panel 32B, the liquid cooling device 132G provided in the light modulation panel 32G that is one of the light modulation panel 32G and the light modulation panel 32B, and the vapor chambers provided in the light modulation panel 32B that is the other one of the light modulation panel 32G and the light modulation panel 32B, and the light modulation panel 32R, respectively.

According to the projector of the present embodiment, the temperature increase of the light modulation panel 32G can be prevented while minimizing the risk of liquid leakage by only cooling the light modulation panel 32G with the liquid cooling device 132G. Further, since the light modulation panels 32B and 32R are cooled by the vapor chambers, the light modulation panels 32B and 32R can be efficiently cooled without increasing the number of pipes for providing the liquid flow path. Therefore, since the cooling efficiency of the light modulation panels 32R, 32G, and 32B is improved, the amount of light incident on the light modulation panels 32R, 32G, and 32B can be increased. Accordingly, a projector that achieves a high luminance can be provided.

Seventh Embodiment

A projector according to a seventh embodiment will be described.

The present embodiment is different from the configuration of the third embodiment in that the light modulation panel 32R is cooled by a vapor chamber. In the present embodiment, the light modulation panels 32G and 32R are cooled by vapor chambers, the light modulation panel 32B is cooled by the liquid cooling device 132B. Therefore, the light modulation panel 32R according to the present embodiment has the same configuration as the light modulation panel 32G shown in FIGS. 11 to 13.

The projector according to the present embodiment includes the light modulation panel 32R, the light modulation panel 32G, the light modulation panel 32B, the liquid cooling device 132B provided in the light modulation panel 32B that is one of the light modulation panel 32G and the light modulation panel 32B, and the vapor chambers provided in the light modulation panel 32G that is the other one of the light modulation panel 32G and the light modulation panel 32B, and the light modulation panel 32R, respectively.

According to the projector of the present embodiment, the risk of liquid leakage can be minimized by only cooling the light modulation panel 32B with the liquid cooling device 132B, and the working lifetime of the light modulation panel 32B can be increased by improving the light resistance thereof. Further, since the light modulation panels 32G and 32R are cooled by the vapor chambers, the light modulation panels 32G and 32R can be efficiently cooled without increasing the number of pipes for providing the liquid flow path. Therefore, since the cooling efficiency of the light modulation panels 32R, 32G, and 32B is improved, the amount of light incident on the light modulation panels 32R, 32G, and 32B can be increased. Accordingly, a projector that achieves a high luminance can be provided.

First Modification

Next, a first modification of the projector will be described. Regarding a projector according to the present modification, the layout of the members in the exterior housing 5 is different from that of the projector 1 of the first embodiment, and other configurations are common. Hereinafter, the layout of the members in the exterior housing 5 is mainly described, the common configurations as those in the first embodiment are denoted by the same reference numerals, and the description thereof will be omitted or simplified.

Figure 15:
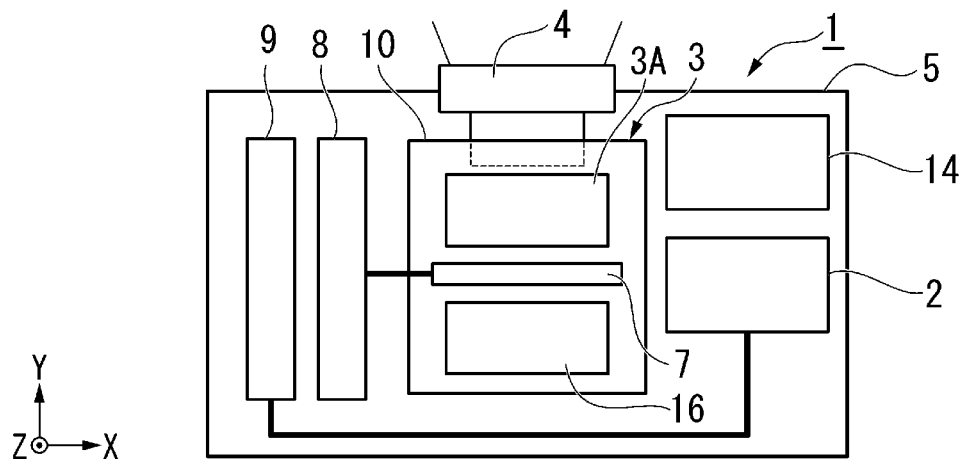
FIG. 15 is a diagram schematically showing a layout inside an exterior housing according to a first modification.

FIG. 15 is a diagram schematically showing the layout of the members in the exterior housing in the present modification.

As shown in FIG. 15, the power supply unit 14 and the light source unit 2 are disposed on the right side that is the +X side with respect to the image forming unit 3 in the exterior housing 5, and are arranged in order along the front-rear direction Y in which the image forming portion 3A, the heat exchanger 7 for panel heat absorption and the panel fans 16 are arranged in order in the case 10 of the image forming unit 3. That is, in the present modification, the power supply unit 14 does not overlap with the light source unit 2 in the up-down direction Z.

According to the present modification, since the power supply unit 14 and the light source unit 2 are disposed side by side along the front-rear direction Y, it is possible to prevent the size of the exterior housing 5 from increasing in the left-right direction X and the up-down direction Z. Therefore, it is possible to provide a projector whose size is reduced in the left-right direction X and the up-down direction Z.

Second Modification

Next, a second modification of the projector will be described. Regarding a projector according to the present modification, the layout of the members in the exterior housing 5 is different from that of the projector 1 of the first embodiment, and other configurations are common. Hereinafter, the layout of the members in the exterior housing 5 is mainly described, the common configurations as those in the first embodiment are denoted by the same reference numerals, and the description thereof will be omitted or simplified.

Figure 16:
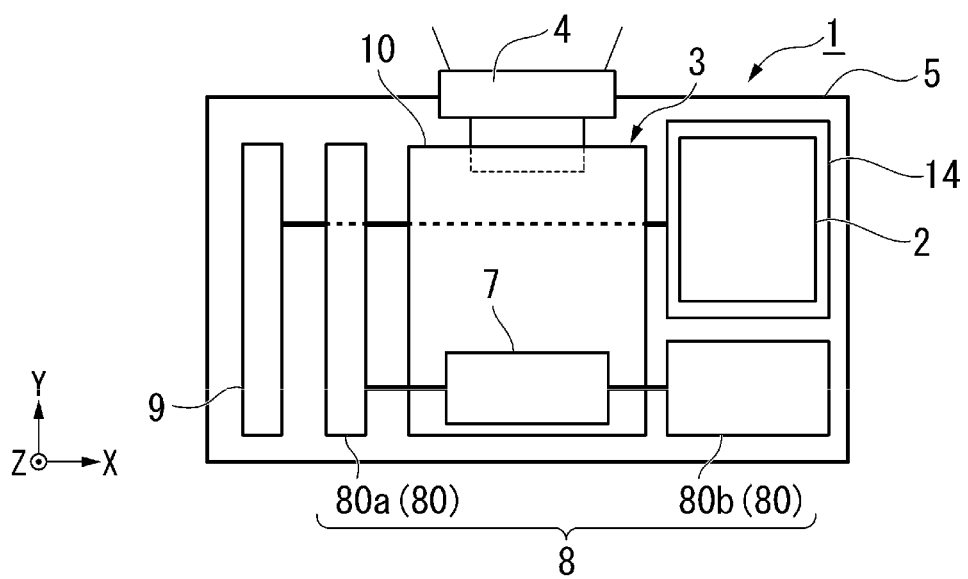
FIG. 16 is a diagram schematically showing a layout inside an exterior housing according to a second modification.

FIG. 16 is a diagram schematically showing the layout of the members in the exterior housing in the present modification.

As shown in FIG. 16, the heat exchanger 8 for panel heat dissipation according to the present modification includes a plurality of radiator main bodies 80. The radiator main bodies 80 include a first radiator main body 80a and a second radiator main body 80b. Similar to the projector 1 according to the first embodiment, the first radiator main body 80a is disposed on the left side that is the −X side, which is the other side with respect to the image forming unit 3 in the left-right direction X. The second radiator main body 80b is disposed on the right side that is the +X side, which is one side of the left-right direction X with respect to the image forming unit 3 in the exterior housing 5. The first radiator main body 80a and the second radiator main body 80b are thermally coupled to the heat exchanger 7 for panel heat absorption. Further, in the present modification, the light source unit 2 and the power supply unit 14 overlap with each other in the up-down direction Z.

According to the present modification, the size of the radiator main bodies 80 is reduced by separating the radiator main bodies 80 constituting the heat exchanger 8 for panel heat dissipation in the left-right direction X. Accordingly, it is possible to improve the cooling performance of the heat exchanger 8 for panel heat dissipation while preventing the size of the exterior housing 5 from increasing by effectively using the space inside the exterior housing 5.

Third Modification

Next, a third modification of the projector will be described. Regarding a projector according to the present modification, the layout of the members in the exterior housing 5 is different from that of the projector 1 of the first embodiment, and other configurations are common. Hereinafter, the layout of the members in the exterior housing 5 is mainly described, the common configurations as those in the first embodiment are denoted by the same reference numerals, and the description thereof will be omitted or simplified.

Figure 17:
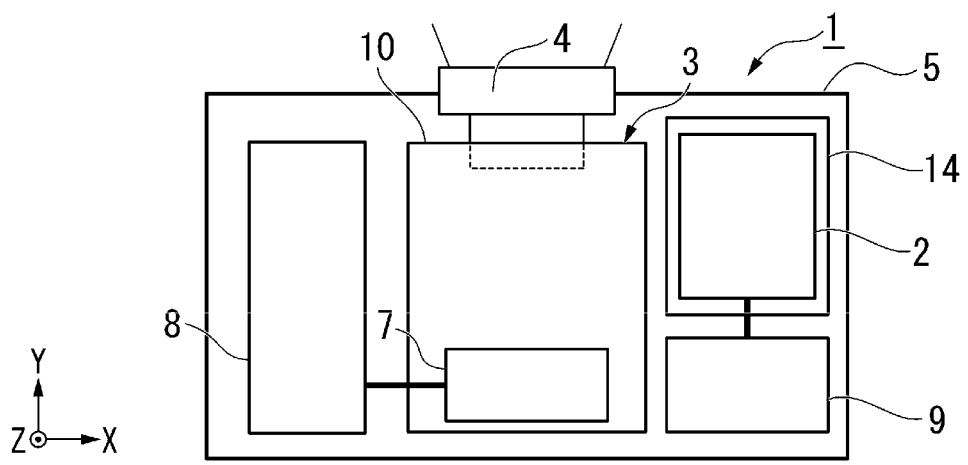
FIG. 17 is a diagram schematically showing a layout inside an exterior housing according to a third modification.

FIG. 17 is a diagram schematically showing the layout of the members in the exterior housing in the present modification.

As shown in FIG. 17, the heat exchanger 9 for light source heat dissipation according to the present modification is disposed on the right side that is the +X side in the exterior housing 5, which is one side of the left-right direction X with respect to the image forming unit 3. That is, the heat exchanger 9 for light source heat dissipation is disposed in the space where the light source unit 2 is located in the exterior housing 5. Further, in the present modification, the light source unit 2 and the power supply unit 14 overlap with each other in the up-down direction Z.

According to the present modification, since the heat exchanger 25 for light source heat absorption that absorbs the heat from the light source unit 2 and the heat exchanger 9 for light source heat dissipation are close to each other, a heat transfer path from the heat exchanger 25 for light source heat absorption to the heat exchanger 9 for light source heat dissipation, that is, the length of a pipe through which the heat exchange liquid flows can be shortened.

Therefore, since the heat transfer path is shortened, the cooling efficiency of the light source unit 2 can be improved. In addition, since the heat exchanger 25 for light source heat absorption and the heat exchanger 9 for light source heat dissipation are collectively disposed in the space on the light source unit 2 side in the exterior housing 5, a routing structure for a supply path of the heat exchange liquid between the heat exchanger 25 for light source heat absorption and the heat exchanger 9 for light source heat dissipation can be simplified.

Fourth Modification

Next, a fourth modification of the projector will be described. A projector according to the present modification is different from the projector 1 according to the first embodiment in that the projector includes four panel fans 16 instead of three, and other configurations are common. Hereinafter, a structure of ducts when the number of panel fans 16 is four is mainly described, the common configurations as those in the first embodiment are denoted by the same reference numerals, and the description thereof will be omitted or simplified.

Figure 18:
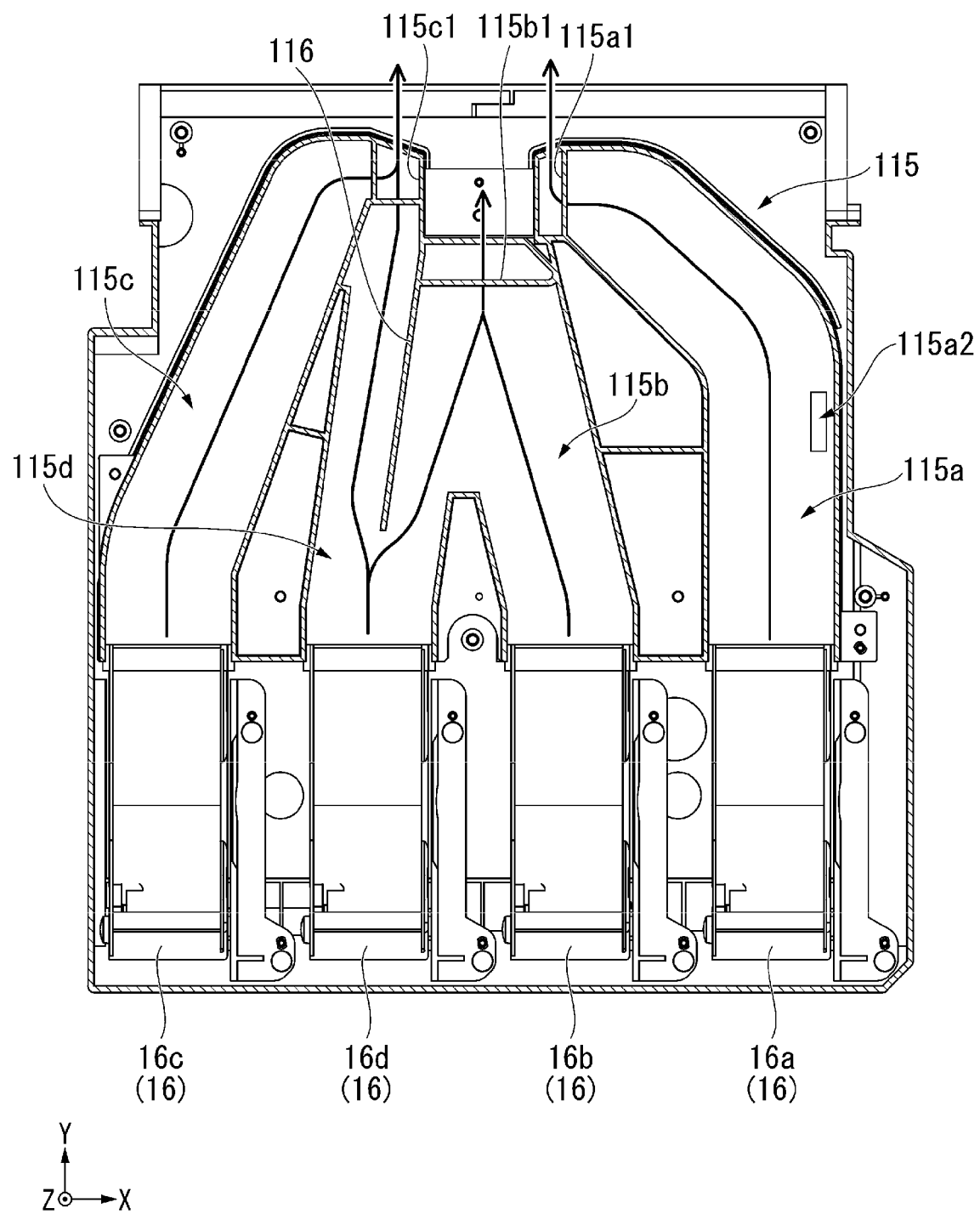
FIG. 18 is a diagram showing a configuration in which four panel fans are provided according to a fourth modification.

FIG. 18 is a diagram showing a configuration of the panel fans 16 and ducts 115 in the present modification.

As shown in FIG. 18, in the present modification, the panel fans 16 include the first fan 16*a*, the second fan 16*b*, the third fan 16*c* and a fourth fan 16*d*. The fans 16*a*, 16*b*, 16*c* and 16*d* are arranged along the heat exchanger 7 for panel heat absorption in the left-right direction X. The ducts 115 include a first duct portion 115*a*, a second duct portion 115*b*, a third duct portion 115*c* and a fourth duct portion 115*d*.

The first duct portion 115*a* includes a supply port 115*a*1 for supplying an air flow from the first fan 16*a* toward the light modulation panel 32R, and a supply port 115*a*2 for supplying a part of the air flow from the first fan 16*a* toward the uniform illumination optical system 30. The second duct portion 115*b* includes a supply port 115*b*1 for supplying an air flow from the second fan 16*b* toward the light modulation panel 32G.

The third duct portion 115*c* includes a supply port 115*c*1 for supplying an air flow from the third fan 16*c* toward the light modulation panel 32B. The fourth duct portion 115*d* separates an air flow from the fourth fan 16*d* into two parts by a partition wall 116, merges one of the separated air flows with the supply port 115*c*1 of the third duct portion 115*c*, and merges the other separated air flow with the supply port 115*b*1 of the second duct portion 115*b*.

Thus, according to the present modification, the cooling efficiency of the light modulation panel 32G can be further improved by supplying the air flow from the second fan 16*b* and a part of the air flow from the fourth fan 16*d* to the light modulation panel 32G having a large heat generation amount, and the temperature increase of the panel can be prevented. Further, the cooling efficiency of the light modulation panel 32B is improved by supplying the air flow from the third fan 16*c* and a part of the air flow from the fourth fan 16*d* to the light modulation panel 32B on which light with high energy is incident, and thus the working lifetime of the panel can be increased.

Fifth Modification

Next, a fifth modification of the projector will be described. A projector according to the present modification is different from the projector 1 according to the first embodiment in the configuration of the light modulation panel 32G provided with the vapor chamber 60, and other configurations are common. Hereinafter, the difference in the configuration of the light modulation panel 32G is mainly described, the common configurations as those in the first embodiment are denoted by the same reference numerals, and the description thereof will be omitted or simplified.

Figure 19:
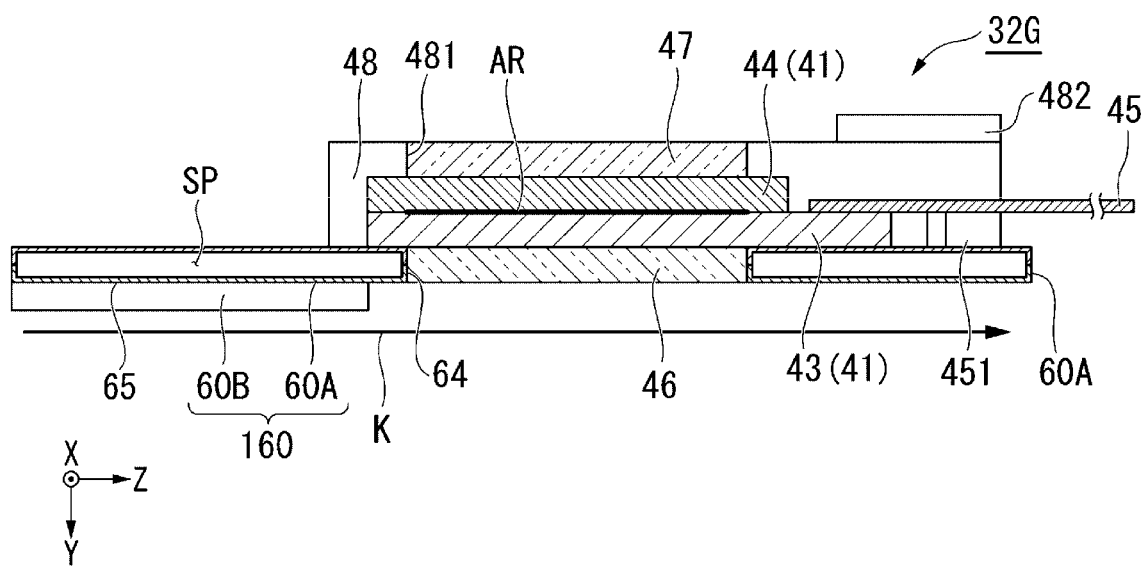
FIG. 19 is a cross-sectional view showing a configuration of a light modulation panel according to a fifth modification.

FIG. 19 is a cross-sectional view showing the configuration of the light modulation panel 32G in the present modification.

As shown in FIG. 19, in the light modulation panel 32G according to the present modification, the heat dissipating portion 65 of a vapor chamber 160 is provided on the −Z side with respect to the opening 64 formed in the main body portion 60A of the vapor chamber 160. The heat dissipating member 60B is provided on a surface of the heat dissipating portion 65 on the +Y side. In the present modification, the heat dissipating portion 65 of the vapor chamber 160 is located upstream of the air flow K flowing from the panel fans 16 to the light modulation panel 32G.

According to this configuration, since the air flow K cools the heat dissipating portion 65 first, the condensation of the refrigerant can be promoted in the vapor chamber 160 as compared with the case where the air flow K cools the panel main body 41 first. Therefore, the cooling performance of the vapor chamber 160 according to the present modification can be further improved.

Sixth Modification

The position where the heat dissipating portion 65 is provided in the vapor chamber 60 is not limited to the above position.

Figure 20:
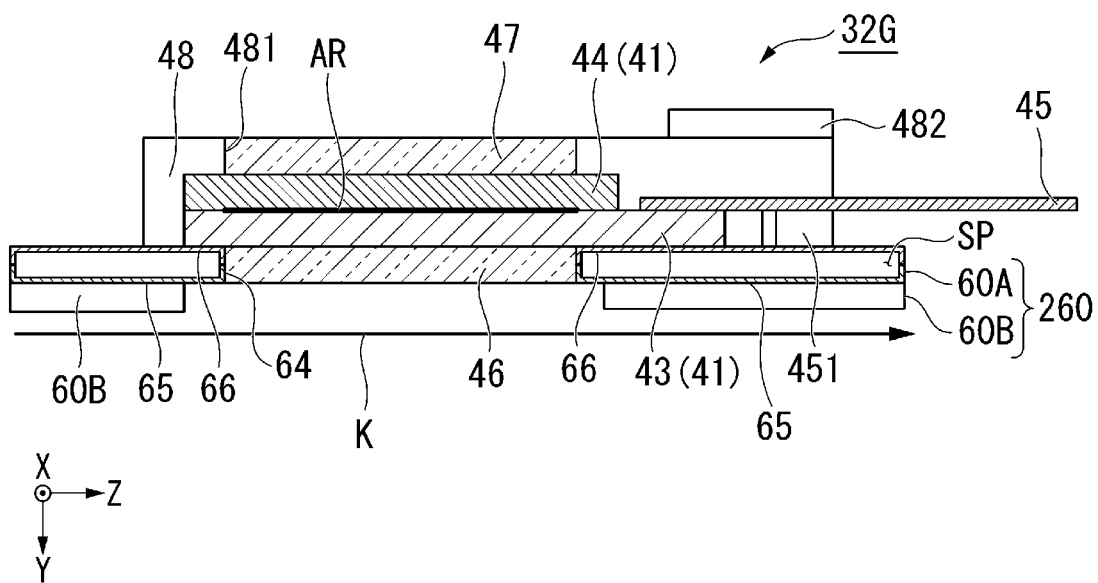
FIG. 20 is a cross-sectional view showing a configuration of a light modulation panel according to a sixth modification.

FIG. 20 is a view showing a configuration of the light modulation panel 32G in the present modification.

As shown in FIG. 20, in the light modulation panel 32G according to the present modification, a vapor chamber 260 is provided with the heat dissipating portions 65 on both the −Z side and the +Z side with respect to the opening 64.

The heat dissipating members 60B are provided on the surfaces of the heat dissipating portions 65 on the +Y side. According to the vapor chamber 260 having this configuration, since the heat dissipating portions 65 are located on both windward and leeward sides of the air flow K, the evaporation and the condensation of the refrigerant can be promoted in the vapor chamber 260. Therefore, according to the present modification, the vapor chamber 260 with the further improved cooling performance can be provided.

The technical scope of the present disclosure is not limited to the above-described embodiments and modifications, and various changes can be added without departing from the spirit of the present disclosure.

In the above-described embodiments, the case where the air flow K flows from the heat exchanger 8 for panel heat dissipation toward the heat exchanger 9 for light source heat dissipation is taken as an example, and the air flow K may flow from the heat exchanger 9 for light source heat dissipation toward the heat exchanger 8 for panel heat dissipation. That is, the heat exchanger 9 for light source heat dissipation may be located close to the image forming unit 3 with respect to the heat exchanger 8 for panel heat dissipation.

In this case, the surface area of the heat exchanger 9 for light source heat dissipation may be larger than the plane area of the heat exchanger 8 for panel heat dissipation. According to this configuration, a sufficient cooling effect against heat at a high temperature can be achieved by increasing the surface area of the heat exchanger 9 for light source heat dissipation disposed on the windward side of the air flow K. Therefore, the heat at a high temperature transferred from the light source unit 2 can be efficiently cooled.

In the above-described embodiments and modifications, the air flows from the panel fans 16 are also supplied to a light modulation panel that is cooled by a liquid cooling device. Alternatively, the air flows from the panel fans 16 may not be supplied to the light modulation panel that is cooled by the liquid cooling device.

For example, when the air flow is only supplied to the light modulation panel 32R, the number of panel fans 16 may be one, and the light modulation panel 32R may be efficiently cooled by merging the air flows from the panel fans 16 in a duct.

In addition, all the light modulation panels 32R, 32G, and 32B may be cooled by the air flows from the panel fans 16. All the light modulation panels 32R, 32G, and 32B may be cooled by the vapor chamber 60.

In addition, a specific configuration on the number, arrangements, shapes, materials, and the like of various components constituting the projector and the image forming unit is not limited to the above embodiment, and can be appropriately changed.

A projector according to an embodiment of the present disclosure may have the following configuration.

The projector according to the embodiment of the present disclosure includes: an exterior housing constituting an exterior; a light source unit configured to emit illumination light; an image forming unit configured to modulate the illumination light from the light source unit according to image information to generate image light; a projection optical unit configured to project the image light generated by the image forming unit; a first heat exchanger for heat absorption configured to absorb heat generated by the light source unit; a second heat exchanger for heat absorption configured to absorb heat generated by the image forming unit; a first heat exchanger for heat dissipation configured to dissipate heat transferred from the first heat exchanger for heat absorption; a second heat exchanger for heat dissipation configured to dissipate heat transferred from the second heat exchanger for heat absorption; and a heat exchanger fan configured to supply an air flow to the first heat exchanger for heat dissipation and the second heat exchanger for heat dissipation. The first heat exchanger for heat dissipation overlaps with the second heat exchanger for heat dissipation in a flow direction of the air flow, and the air flow flows from one of the first heat exchanger for heat dissipation and the second heat exchanger for heat dissipation toward the other one thereof.

In the projector according to the embodiment of the present disclosure, the exterior housing may include an air discharge wall portion that is formed with an air outlet from which the air flow flowing through the first heat exchanger for heat dissipation and the second heat exchanger for heat dissipation is discharged, the first heat exchanger for heat dissipation may be disposed on the air discharge wall portion side with respect to the second heat exchanger for heat dissipation, and the air flow may flow from the second heat exchanger for heat dissipation toward the first heat exchanger for heat dissipation.

In the projector according to the embodiment of the present disclosure, a surface area of the first heat exchanger for heat dissipation may be larger than a surface area of the second heat exchanger for heat dissipation.

In the projector according to the embodiment of the present disclosure, a surface area of the first heat exchanger for heat dissipation may be larger than a surface area of the second heat exchanger for heat dissipation.

In the projector according to the embodiment of the present disclosure, the image forming unit, the first heat exchanger for heat dissipation and the second heat exchanger for heat dissipation may be arranged in one direction in the exterior housing, and the exterior housing may include a first air inlet that faces a space between the heat exchanger located on an image forming unit side of the first heat exchanger for heat dissipation and the second heat exchanger for heat dissipation and the image forming unit.

In the projector according to the embodiment of the present disclosure, the exterior housing may include a second air inlet that faces a space between the first heat exchanger for heat dissipation and the second heat exchanger for heat dissipation.

In the projector according to the embodiment of the present disclosure, the first air inlet may extend to a position facing a space between the first heat exchanger for heat dissipation and the second heat exchanger for heat dissipation.

In the projector according to the embodiment of the present disclosure, the first heat exchanger for heat dissipation and the second heat exchanger for heat dissipation may have a flat plate shape, and the first heat exchanger for heat dissipation may overlap with the second heat exchanger for heat dissipation in a thickness direction of the flat plate.

A cooling device according to an embodiment of the present disclosure may have the following configuration.

The cooling device according to the embodiment of the present disclosure includes: a first heat source and a second heat source disposed in an exterior housing constituting an exterior; a first heat exchanger for heat absorption configured to absorb heat generated by the first heat source; a second heat exchanger for heat absorption configured to absorb heat generated by the second heat source; a first heat exchanger for heat dissipation configured to dissipate heat transferred from the first heat exchanger for heat absorption; a second heat exchanger for heat dissipation configured to dissipate heat transferred from the second heat exchanger for heat absorption; and a heat exchanger fan configured to supply an air flow to the first heat exchanger for heat dissipation and the second heat exchanger for heat dissipation. The first heat exchanger for heat dissipation overlaps with the second heat exchanger for heat dissipation in a flow direction of the air flow, and the air flow flows from one of the first heat exchanger for heat dissipation and the second heat exchanger for heat dissipation toward the other one thereof.

In the cooling device according to the embodiment of the present disclosure, the first heat exchanger for heat dissipation and the second heat exchanger for heat dissipation may have a flat plate shape, and the first heat exchanger for heat dissipation may overlap with the second heat exchanger for heat dissipation in a thickness direction of the flat plate.

What is claimed is:

1. A projector comprising:
   an exterior housing constituting an exterior;
   a light source unit configured to emit illumination light;
   an image forming unit configured to modulate the illumination light from the light source unit according to image information to generate image light;
   a projection optical unit configured to project the image light generated by the image forming unit;

a first heat exchanger for heat absorption configured to absorb heat generated by the light source unit;

a second heat exchanger for heat absorption configured to absorb heat generated by the image forming unit;

a first heat exchanger for heat dissipation configured to dissipate heat transferred from the first heat exchanger for heat absorption;

a second heat exchanger for heat dissipation configured to dissipate heat transferred from the second heat exchanger for heat absorption; and a heat exchanger fan configured to supply an air flow to the first heat exchanger for heat dissipation and the second heat exchanger for heat dissipation, wherein the first heat exchanger for heat dissipation overlaps with the second heat exchanger for heat dissipation in a flow direction of the air flow, and the air flow flows from one of the first heat exchanger for heat dissipation and the second heat exchanger for heat dissipation toward the other one thereof.

2. The projector according to claim 1, wherein the exterior housing includes an air discharge wall portion that is formed with an air outlet from which the air flow flowing through the first heat exchanger for heat dissipation and the second heat exchanger for heat dissipation is discharged, the first heat exchanger for heat dissipation is disposed on the air discharge wall portion side with respect to the second heat exchanger for heat dissipation, and the air flow flows from the second heat exchanger for heat dissipation toward the first heat exchanger for heat dissipation.

3. The projector according to claim 2, wherein a surface area of the first heat exchanger for heat dissipation is larger than a surface area of the second heat exchanger for heat dissipation.

4. The projector according to claim 1, wherein a surface area of the first heat exchanger for heat dissipation is larger than a surface area of the second heat exchanger for heat dissipation.

5. The projector according to claim 1, wherein the image forming unit, the first heat exchanger for heat dissipation and the second heat exchanger for heat dissipation are arranged in one direction in the exterior housing, and the exterior housing includes a first air inlet that faces a space between the heat exchanger located on an image forming unit side of the first heat exchanger for heat dissipation and the second heat exchanger for heat dissipation and the image forming unit.

6. The projector according to claim 5, wherein the exterior housing includes a second air inlet that faces a space between the first heat exchanger for heat dissipation and the second heat exchanger for heat dissipation.

7. The projector according to claim 5, wherein the first air inlet extends to a position facing a space between the first heat exchanger for heat dissipation and the second heat exchanger for heat dissipation.

8. The projector according to claim 1, wherein the first heat exchanger for heat dissipation and the second heat exchanger for heat dissipation have a flat plate shape, and the first heat exchanger for heat dissipation overlaps with the second heat exchanger for heat dissipation in a thickness direction of the flat plate.

9. The projector according to claim 1, wherein the first heat exchanger for heat absorption and the first heat exchanger for heat dissipation are coupled via a first inflow pipe through which a first heat exchange liquid flows from the first heat exchanger for heat dissipation into the first heat exchanger for heat absorption, and a first outflow pipe through which the first heat exchange liquid heated from the first heat exchanger for heat absorption to the first heat exchanger for heat dissipation flows out, and the second heat exchanger for heat absorption and the second heat exchanger for heat dissipation are coupled via a second inflow pipe through which a second heat exchange liquid flows from the second heat exchanger for heat dissipation into the second heat exchanger for heat absorption, and a second outflow pipe through which the second heat exchange liquid heated from the second heat exchanger for heat absorption to the second heat exchanger for heat dissipation flows out.

10. The projector according to claim 9, wherein the first heat exchange liquid heated from the first heat exchanger for heat absorption to the first heat exchanger for heat dissipation is supplied to the first heat exchanger for heat dissipation via a first reservoir tank, and the second heat exchange liquid heated from the second heat exchanger for heat absorption to the second heat exchanger for heat dissipation is supplied to the second heat exchanger for heat dissipation via a second reservoir tank.

11. A cooling device comprising:

a first heat source and a second heat source disposed in an exterior housing constituting an exterior;

a first heat exchanger for heat absorption configured to absorb heat generated by the first heat source;

a second heat exchanger for heat absorption configured to absorb heat generated by the second heat source;

a first heat exchanger for heat dissipation configured to dissipate heat transferred from the first heat exchanger for heat absorption;

a second heat exchanger for heat dissipation configured to dissipate heat transferred from the second heat exchanger for heat absorption; and a heat exchanger fan configured to supply an air flow to the first heat exchanger for heat dissipation and the second heat exchanger for heat dissipation, wherein the first heat exchanger for heat dissipation overlaps with the second heat exchanger for heat dissipation in a flow direction of the air flow, and the air flow flows from one of the first heat exchanger for heat dissipation and the second heat exchanger for heat dissipation toward the other one thereof.

12. The cooling device according to claim 11, wherein the first heat exchanger for heat dissipation and the second heat exchanger for heat dissipation have a flat plate shape, and the first heat exchanger for heat dissipation overlaps with the second heat exchanger for heat dissipation in a thickness direction of the flat plate.

* * * * *